United States Patent
Puttkammer

(10) Patent No.: US 9,996,787 B2
(45) Date of Patent: Jun. 12, 2018

(54) LAYERED STRUCTURE WITH CONDUCTIVE POLYMER FOR RECOGNITION OF MANIPULATION AND PROCESS FOR THE PRODUCTION THEREOF

(71) Applicant: Heraeus Deutschland GmbH & Co. KG, Hanau (DE)

(72) Inventor: Frank Puttkammer, Coswig (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days. days.

(21) Appl. No.: 14/781,411

(22) PCT Filed: Mar. 31, 2014

(86) PCT No.: PCT/EP2014/000857
§ 371 (c)(1),
(2) Date: Sep. 30, 2015

(87) PCT Pub. No.: WO2014/161651
PCT Pub. Date: Oct. 9, 2014

(65) Prior Publication Data
US 2016/0042268 A1 Feb. 11, 2016

Related U.S. Application Data

(60) Provisional application No. 61/810,314, filed on Apr. 10, 2013.

(30) Foreign Application Priority Data

Apr. 2, 2013 (DE) .......... 10 2013 005 486

(51) Int. Cl.
*G06F 17/00* (2006.01)
*G06K 19/073* (2006.01)
(Continued)

(52) U.S. Cl.
CPC ........ *G06K 19/07345* (2013.01); *B32B 27/00* (2013.01); *B42D 25/00* (2014.10);
(Continued)

(58) Field of Classification Search
CPC ................................. H01B 1/22; H01B 3/004
(Continued)

(56) References Cited

U.S. PATENT DOCUMENTS 4,070,774 A 1/1978 Staats et al.
4,604,230 A 8/1986 Goswami et al.
(Continued)

FOREIGN PATENT DOCUMENTS

CN 1334955 A 2/2002
CN 1452566 A 10/2003
(Continued)

OTHER PUBLICATIONS

International Search Report and Written Opinion issued in PCT/EP2014/000857 dated Aug. 13, 2014.
(Continued)

*Primary Examiner* — Daniel St Cyr
(74) *Attorney, Agent, or Firm* — Blank Rome LLP

(57) ABSTRACT

The invention relates to a layered structure (10) comprising the following layers: a) a first substrate layer (2), wherein the first substrate layer (2) has a first surface (4) and a second surface (6) and is configured as a dielectric; b) a first electrically conductive layer (8) which overlaps at least in part the first substrate layer (2) at least on the first surface (4) of the first substrate layer (2), wherein the first electrically conductive layer (8) comprises an electrically conductive polymer, wherein the first electrically conductive layer (8) has at least one first part region (18) and at least one further part region (20), wherein the at least one first part region (18)
(Continued)

has a higher bonding strength to the substrate layer (2) than to the at least one further part region (20).

22 Claims, 18 Drawing Sheets

(51) Int. Cl.
B42D 25/29 (2014.01)
B42D 25/00 (2014.01)
B32B 27/00 (2006.01)
H05K 1/09 (2006.01)
H05K 1/03 (2006.01)
B42D 25/373 (2014.01)
G06K 7/10 (2006.01)
G06Q 30/00 (2012.01)
H05K 1/11 (2006.01)
H05K 3/00 (2006.01)
B41M 1/10 (2006.01)
B41M 1/12 (2006.01)
B41M 3/00 (2006.01)
B41M 3/14 (2006.01)
H05K 1/02 (2006.01)
H05K 3/40 (2006.01)
H05K 3/46 (2006.01)

(52) U.S. Cl.
CPC ........... *B42D 25/29* (2014.10); *B42D 25/373* (2014.10); *G06K 7/10118* (2013.01); *G06Q 30/0185* (2013.01); *H05K 1/0275* (2013.01); *H05K 1/0293* (2013.01); *H05K 1/0298* (2013.01); *H05K 1/0333* (2013.01); *H05K 1/0386* (2013.01); *H05K 1/095* (2013.01); *H05K 1/115* (2013.01); *H05K 3/0064* (2013.01); *H05K 3/4644* (2013.01); *B41M 1/10* (2013.01); *B41M 1/12* (2013.01); *B41M 3/006* (2013.01); *B41M 3/14* (2013.01); *B42D 2033/10* (2013.01); *B42D 2033/22* (2013.01); *B42D 2033/30* (2013.01); *B42D 2033/32* (2013.01); *B42D 2033/46* (2013.01); *H05K 1/0268* (2013.01); *H05K 3/4053* (2013.01); *H05K 3/4688* (2013.01); *H05K 2201/0329* (2013.01); *H05K 2201/0391* (2013.01)

(58) Field of Classification Search
USPC .......................... 235/375, 439; 252/500, 514
See application file for complete search history.

(56) References Cited

U.S. PATENT DOCUMENTS

| | | | |
|---|---|---|---|
| 4,746,556 A | 5/1988 | Matsuguchi et al. | |
| 5,631,039 A | 5/1997 | Knight et al. | |
| 5,683,774 A | 11/1997 | Faykish et al. | |
| 5,770,283 A * | 6/1998 | Gosselin | G09F 3/0292 206/807 |
| 5,876,068 A | 3/1999 | Schneider et al. | |
| 5,913,543 A | 6/1999 | Curiel | |
| 6,214,443 B1 | 4/2001 | Palmasi et al. | |
| 6,435,408 B1 | 8/2002 | Irwin, Jr. et al. | |
| 6,692,664 B2 * | 2/2004 | St. John | H01B 1/22 252/500 |
| 2001/0009273 A1 | 7/2001 | John | |
| 2002/0036237 A1 | 3/2002 | Atherton et al. | |

FOREIGN PATENT DOCUMENTS

| | | |
|---|---|---|
| DE | 2416652 A1 | 10/1975 |
| DE | 29606281 U1 | 6/1996 |
| DE | 19754068 A1 | 6/1999 |
| DE | 19755793 A1 | 7/1999 |
| EP | 0170712 A1 | 2/1986 |
| EP | 0398635 A2 | 11/1990 |
| EP | 0869408 A1 | 10/1998 |
| EP | 0955616 A1 | 11/1999 |
| EP | 1113059 A2 | 7/2001 |
| EP | 1168111 A2 | 1/2002 |
| EP | 1172759 A1 | 1/2002 |
| EP | 2 006 794 | 12/2008 |
| EP | 1386754 B1 | 8/2011 |
| GB | 2243139 A | 10/1991 |
| JP | 2000057292 A | 2/2000 |
| JP | 2001013874 A | 1/2001 |
| JP | 2005025514 A | 1/2005 |
| JP | 2008282103 A | 11/2008 |
| JP | 2011168814 A | 9/2011 |
| WO | WO-9602048 A1 | 1/1996 |
| WO | WO-9607996 A2 | 3/1996 |
| WO | WO-9913157 A1 | 3/1999 |
| WO | WO 9955791 | 11/1999 |
| WO | WO-0171848 A1 | 9/2001 |
| WO | WO-0193231 A1 | 12/2001 |
| WO | WO-0198425 A1 | 12/2001 |
| WO | WO-2004/037560 | 5/2004 |
| WO | WO/2013/037492 | 3/2013 |

OTHER PUBLICATIONS

Kirk-Othmer "Encyclopedia of Chemical Technology", 1994, vol. 9, p. 65.
Kirk-Othmer "Encyclopedia of Chemical Technology", 1998, vol. Supplement Volume, p. 480.

* cited by examiner

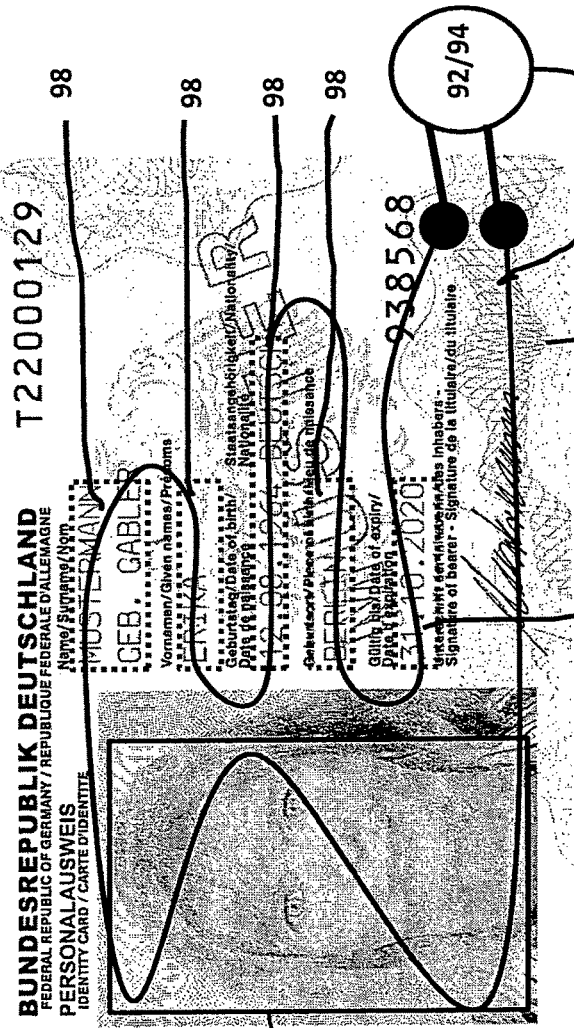
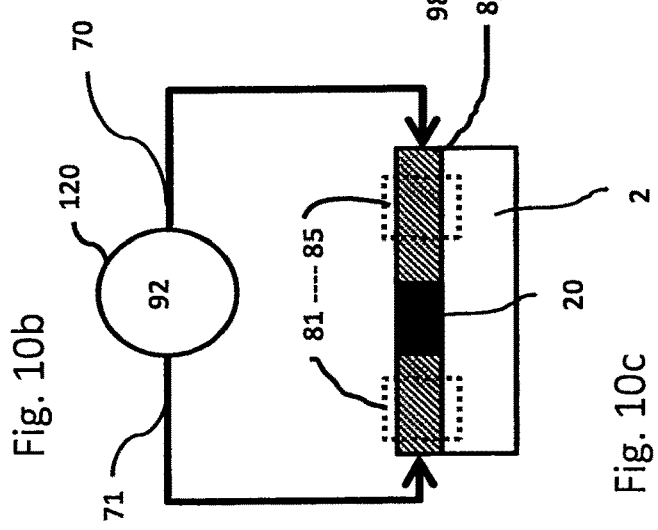
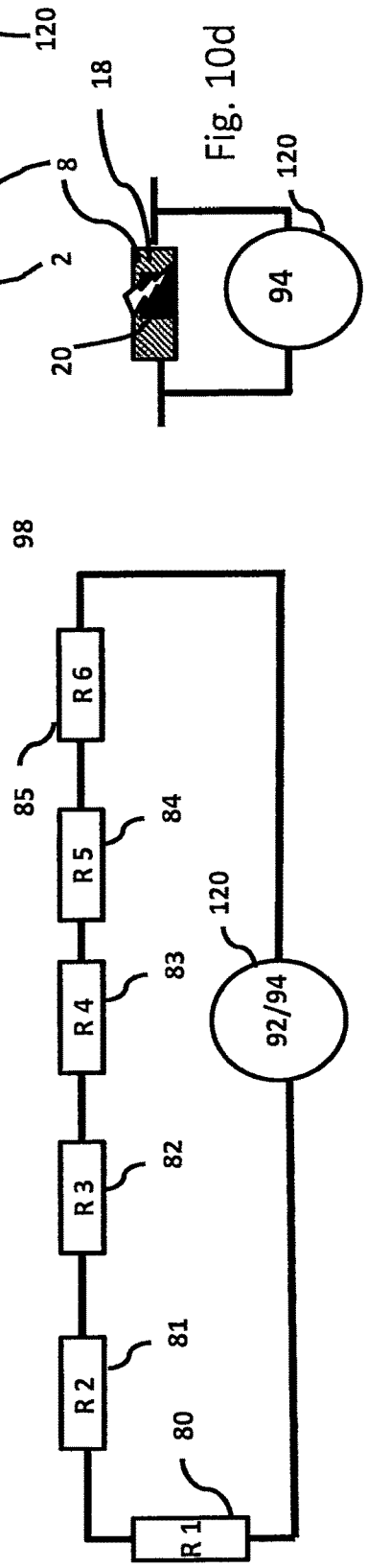
Fig. 10a
Fig. 10b
Fig. 10c
Fig. 10d

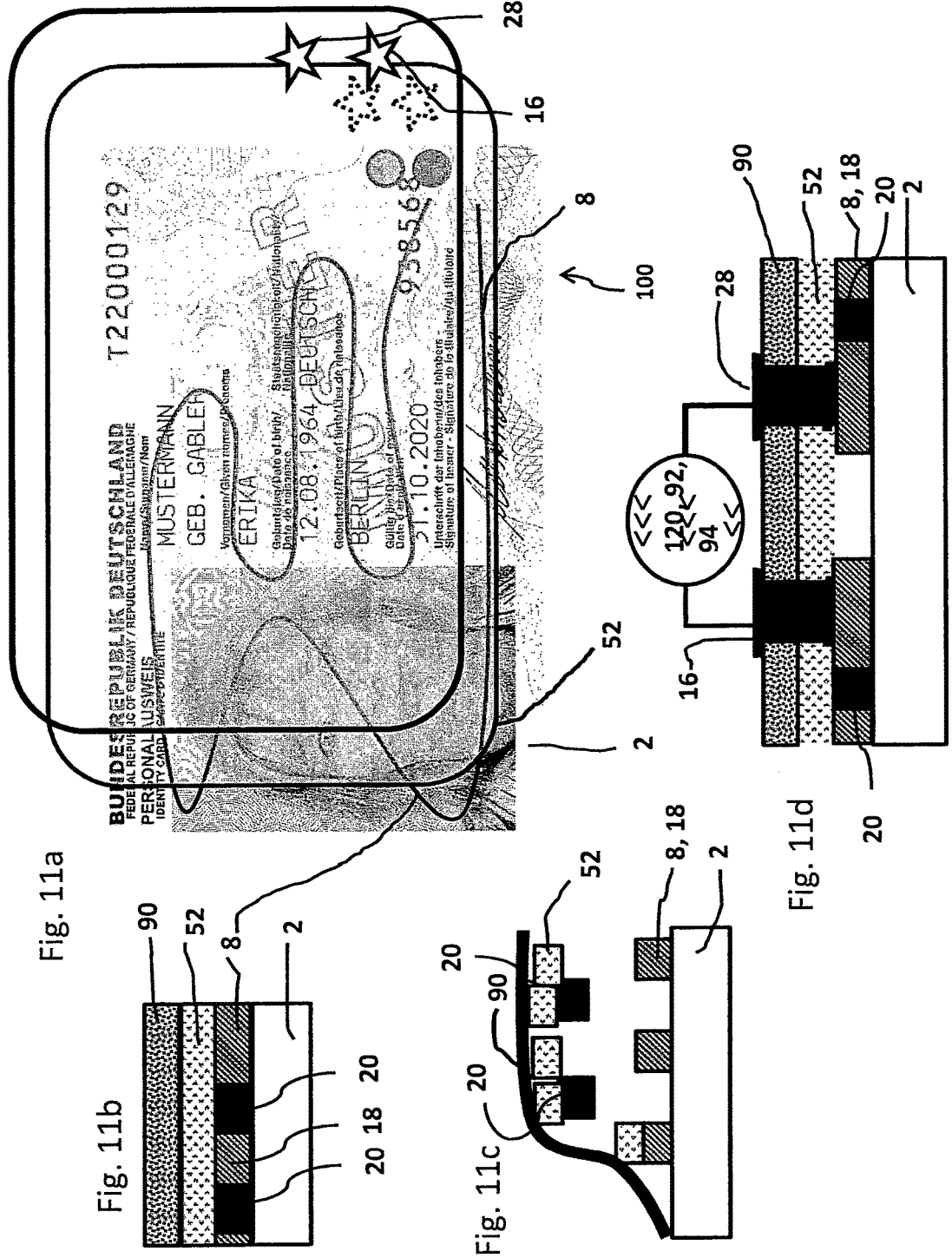

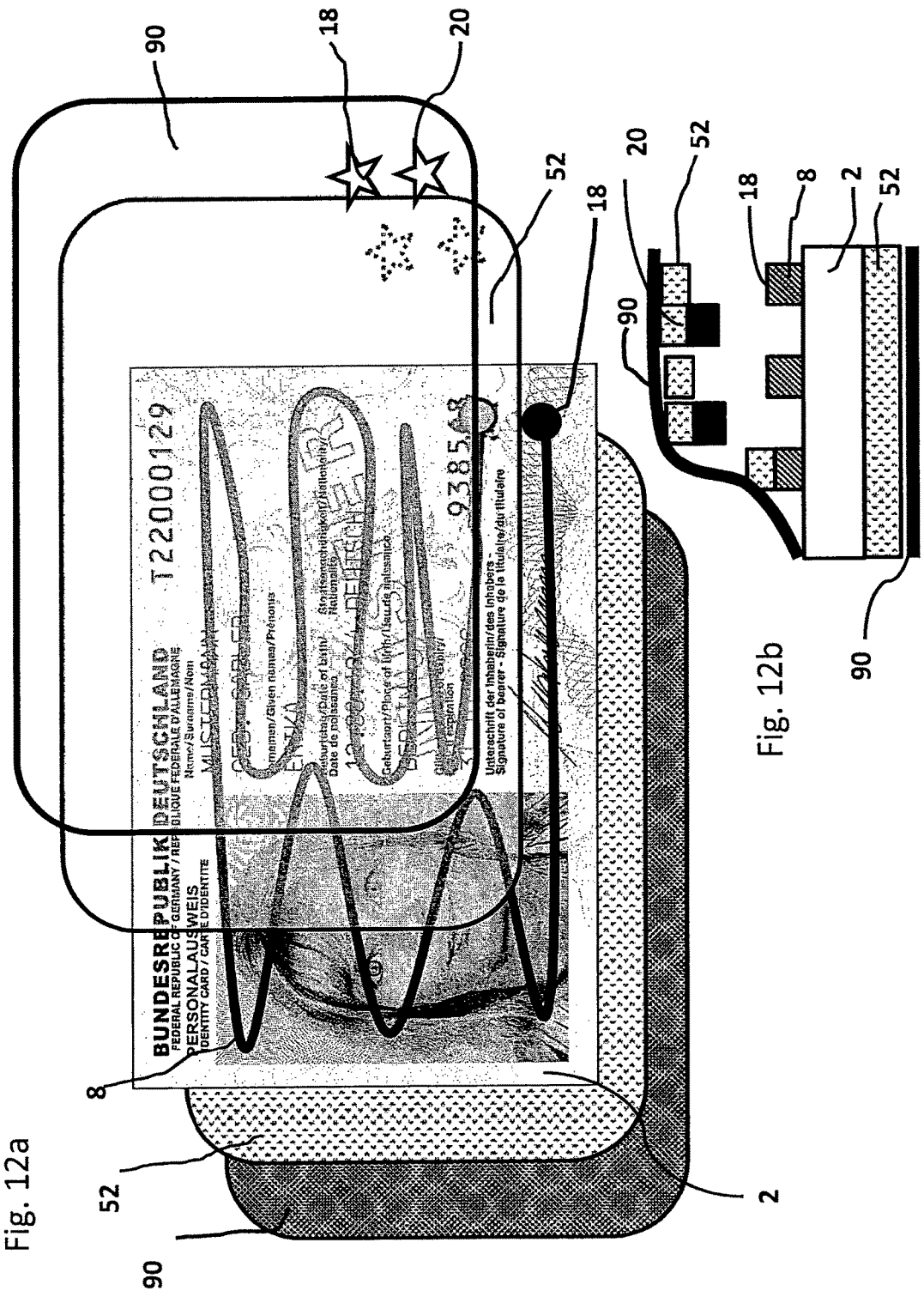
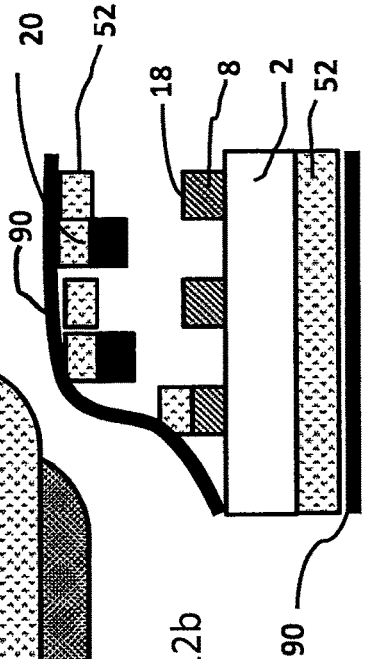
Fig. 12a
Fig. 12b

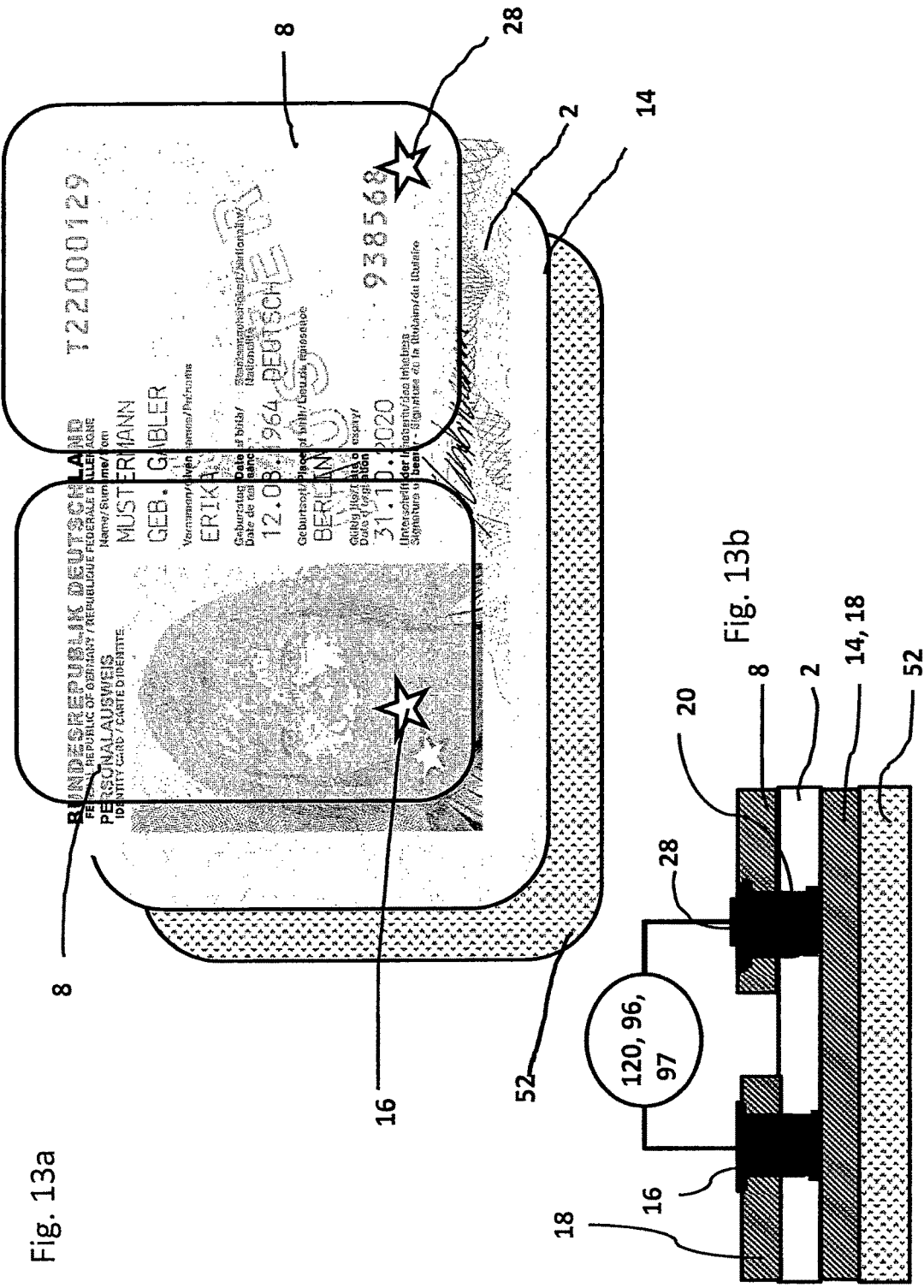

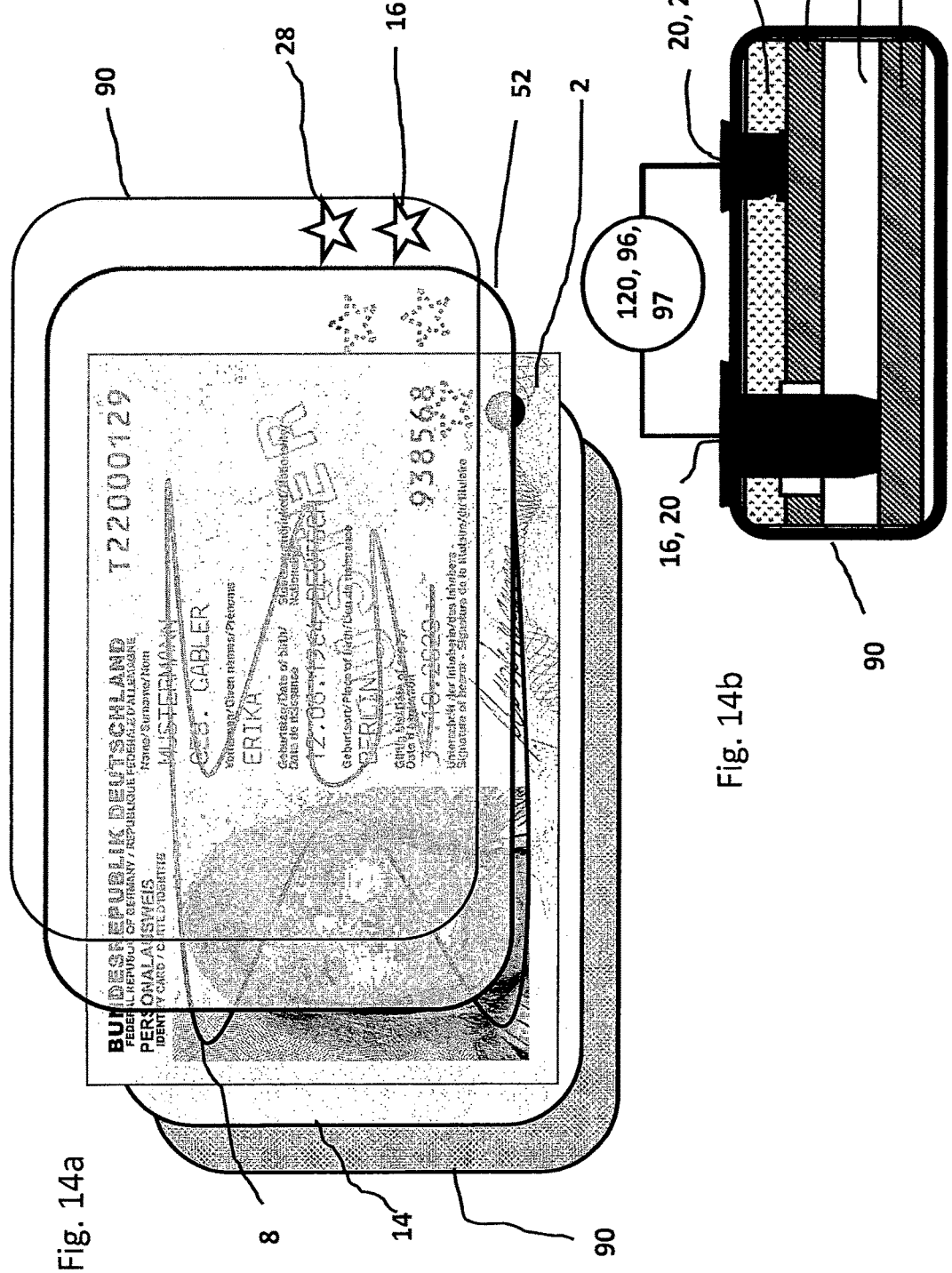

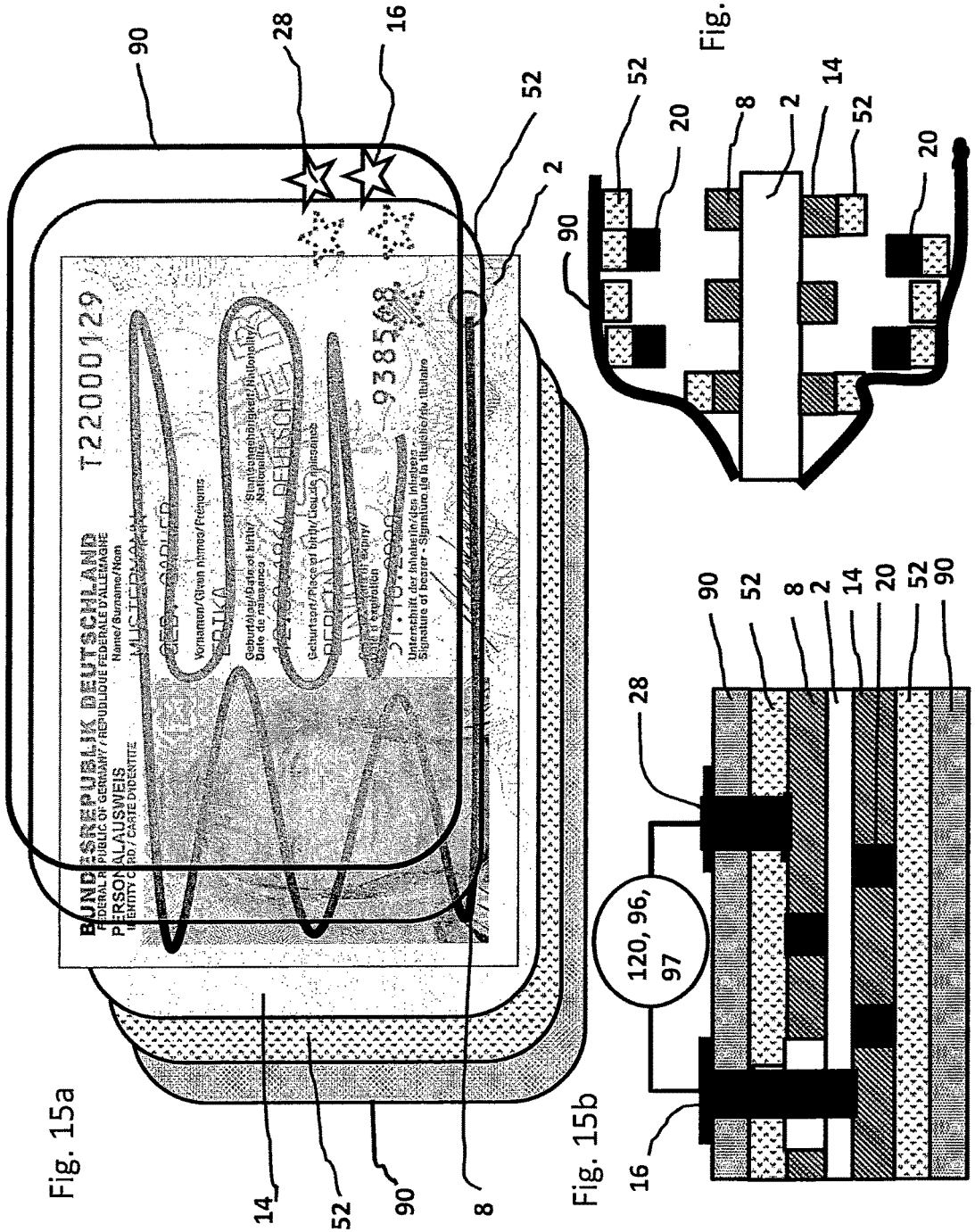

LAYERED STRUCTURE WITH CONDUCTIVE POLYMER FOR RECOGNITION OF MANIPULATION AND PROCESS FOR THE PRODUCTION THEREOF

The invention relates to a layered structure comprising the following layers: a) a first substrate layer, wherein the first substrate layer has a first surface and a second surface and is configured as a dielectric; b) a first electrically conductive layer which overlaps at least in part the first substrate layer at least on the first surface of the first substrate layer; wherein the first electrically conductive layer comprises an electrically conductive polymer, wherein the first electrically conductive layer has at least one first part region and at least one further part region, wherein the at least one first part region has a higher bonding strength to the substrate layer than to the at least one further part region.

The invention furthermore relates to a process for the production of a layered structure, comprising the process steps: i) provision of a first substrate layer, wherein the first substrate layer has a first surface and a second surface, ii) application of a first electrically conductive composition to at least a part of the first surface or the second surface of the first substrate layer to form at least one first part region of an electrically conductive layer, wherein the electrically conductive composition comprises an electrically conductive polymer; iii) application of a further electrically conductive composition to at least a part of the first surface, the second surface or between the first surface and the second surface to form at least one further part region of the electrically conductive layer, wherein the electrically conductive composition comprises an electrically conductive polymer; iv) contacting of at least a part of the at least one first part region with the further electrically conductive composition to form the electrically conductive layer, wherein the at least one first part region of the electrically conductive layer has a lower bonding strength to the at least one further part region than to the substrate layer.

The invention furthermore relates to a layered structure obtainable by the process according to the invention and an object comprising a layered structure according to the invention and a method for determination of information of the layered structure according to the invention.

Methods for recognition of security codes or for data transmission are known from the prior art. Thus, for example, the application of radio frequency (RF) codes to goods or packaging of goods in order to store and to make available batch data, shelf life data or other important data is known. This is described, for example, in EP 2 006 794 A1 for RFID systems.

Measures for protection against copying for important documents, such as identity cards, bank notes, driving license and many others are furthermore known. These usually function in a contactless manner via electronic reading of a chip or via optical security features, such as, for example, in U.S. Pat. No. 5,770,283 A.

Generally, one object of the present invention is to at least partly overcome the disadvantages emerging from the prior art.

A further object comprises providing a layered structure which has electrical information which can easily be checked.

One object comprises providing a measure to protect against copying which influences the visual impression of the object to be protected as little as possible. This applies in particular to objects having coloured representations, such as bank notes, permits, certificates and securities.

One object furthermore comprises providing a layered structure having at least one item of electrical information, of which at least one item of information can be changed by mechanical or chemical action. In particular, the counterfeiting of the layered structure should represent a high technological hurdle for counterfeiters.

A further object comprises providing a process for the production of a layered structure or of an object having a layered structure which is inexpensive and efficient and in particular represents a high technological hurdle for counterfeiters.

An object furthermore comprises providing an object which comprises at least one item of electrical information on which it can easily be checked whether the information has been changed.

An object in turn comprises providing an object on which it can easily be recognized whether it has been manipulated manually or chemically.

A contribution towards achieving at least one of the abovementioned objects is made by the subject matter of the classifying claims. The subject matter of the sub-claims which are dependent upon the classifying claims represents preferred embodiments.

A first subject matter of the present invention is a layered structure comprising the following layers:
  a) a first substrate layer, wherein the first substrate layer has a first surface and a second surface and is configured as a dielectric;
  b) a first electrically conductive layer which overlaps at least in part the first substrate layer at least on the first surface of the first substrate layer,
wherein the first electrically conductive layer comprises an electrically conductive polymer,
wherein the first electrically conductive layer has at least one first part region and at least one further part region,
wherein the at least one first part region has a higher bonding strength to the substrate layer than to the at least one further part region.

The first substrate layer can comprise any material which the person skilled in the art would choose as a dielectric for a layered structure. A dielectric is preferably a material which has a preferably high electrical resistance. Preferably, the dielectric conducts no or virtually no electrical current. Preferably, the substrate layer comprises a material chosen from the group consisting of a polymer, a glass, a ceramic or a mixture of at least two of these. Preferably, the substrate layer comprises a polymer.

The polymer is preferably a polymer which cannot or virtually cannot conduct electric current. The polymer can be chosen from a synthetic, from a natural polymer or a mixture thereof. The polymer is preferably chosen from the group consisting of a polyethylene, polypropylene, a polyethylene terephthalate, a polyvinyl alcohol, a polyvinylpyrrolidone, a polyvinyl chloride, a polyvinyl acetate, a polyvinyl butyrate, a polyacrylic acid ester, a polyacrylic acid amide, a polymethacrylic acid ester, a polymethacrylic acid amide, a polyacrylonitrile, a styrene/acrylic acid ester copolymer, a vinyl acetate/acrylic acid ester copolymer and an ethylene/vinyl acetate copolymer, a polybutadiene, a polyisoprene, a polystyrene, a polyether, a polyester, a polycarbonate, a polyurethane, a polyamide, a polyimide, a polysulphone, a melamine-formaldehyde resin, an epoxy resin, a silicone resin and a cellulose or a mixture of at least two of these. Preferably, the substrate layer comprises a cellulose as the polymer, for example in the form of paper.

The paper preferably has a density in a range of from 10 to 500 g/m², or preferably in a range of from 20 to 400 g/m², or preferably in a range of from 50 to 350 g/m².

The glass can be any glass which the person skilled in the art would choose for the substrate layer in a layered structure. The glass is preferably chosen from the group consisting of an alkali glass, a non-alkali glass, a silicate glass or a mixture of at least two of these. The glass is preferably chosen from the group consisting of a soda-lime glass, a lead-alkali glass, borosilicate glass, aluminium silicate glass, quartz glass or a mixture of at least two of these.

The ceramic can be any ceramic material which the person skilled in the art would choose for the substrate layer in a layered structure. Preferably, the ceramic comprises a material chosen from the group consisting of a BeO, a $ZrO_3$, an $Fe_2O_3$, an $Al_2O_3$, a silicon carbide, a silicon oxide and a silicate, such as feldspar, or a mixture of at least two of these.

Preferably, the first substrate layer comprises a polymer in a range of from 10 to 100 wt. %, or preferably in a range of from 40 to 100 wt. %, or preferably in a range of from 60 to 100 wt. %, based on the total amount of the first substrate layer. Preferably, the first substrate layer is a film comprising polycarbonate, particularly preferably made of polycarbonate. The first substrate layer furthermore preferably is made of a paper, in particular a paper of which the surface is calendered, or coated with a polymer. The polymer can be chosen from the group of the polymers mentioned above for the first substrate layer. The polymer can be applied to the paper by means of extrusion, for example through a die, a slit or a matrix, or by printing and coating processes, especially if the polymer is present in the form of a dispersion.

The first substrate layer can have any form which the person skilled in the art would choose for a substrate layer in a layered structure. The first substrate layer preferably has a flat or film-like form. The first substrate layer preferably has a first surface having an area in a range of from 0.1 to 10,000 cm², preferably in a range of from 0.5 to 5,000 cm², or preferably in a range of from 1 to 1,000 cm². The substrate layer preferably has a thickness in a range of from 0.01 to 100 mm, preferably in a range of from 0.05 to 10 mm, or preferably in a range of from 0.1 to 5 mm. The substrate layer preferably has a second surface having an area in a range of from 0.1 to 10,000 cm², preferably in a range of from 0.5 to 5,000 cm², or preferably in a range of from 1 to 1,000 cm². The second surface preferably runs parallel or virtually parallel to the first surface of the substrate layer. The substrate layer can comprise any material which the person skilled in the art would choose as a dielectric for a substrate layer in a layered structure.

The first electrically conductive layer can comprise any material which the person skilled in the art would choose for an electrically conductive layer in a layered structure which comprises an electrically conductive polymer. Examples of known electrically conductive polymers or also π-conjugated polymers are polypyrroles, polythiophenes, polyanilines, polyacetylenes, polyphenylenes and poly(p-phenylene-vinylenes). The first electrically conductive layer comprises the electrically conductive polymer preferably in a range of from 10 to 99 wt. %, or in a range of from 30 to 95 wt. %, or in a range of from 50 to 90 wt. %, based on the total amount of the first electrically conductive layer.

In addition to the electrically conductive polymer, the electrically conductive layer can comprise at least one further component chosen from the group consisting of an organic component, an inorganic component or a mixture of these.

The organic component can be chosen from the group consisting of a polymer, an aliphatic hydrocarbon, an aromatic hydrocarbon, a hydrocarbon having at least one functional group or a mixture of at least two of these.

The polymer of the organic component is preferably chosen from the group consisting of a polyethylene, a polyethylene terephthalate, a polyvinyl alcohol, a polyvinylpyrrolidone, a polyvinyl chloride, a polyvinyl acetate, a polyvinyl butyrate, a polyacrylic acid ester, a polyacrylic acid amide, a polymethacrylic acid ester, a polymethacrylic acid amide, a polyacrylonitrile, a styrene/acrylic acid ester copolymer, a vinyl acetate/acrylic acid ester copolymer and an ethylene/vinyl acetate copolymer, a polybutadiene, a polyisoprene, a polystyrene, a polyether, a polyester, a polycarbonate, a polyurethane, a polyamide, a polyimide, a polysulphone, a melamine-formaldehyde resin, an epoxy resin, a silicone resin and a cellulose or a mixture of at least two of these. Possible polymers are furthermore preferably also those which are produced by addition of crosslinking agents, such as, for example, melamine compounds, masked isocyanates or functional silanes, such as e.g. 3-glycidoxypropyltrialkoxysilane, tetraethoxysilane and tetraethoxysilane hydrolysate, or crosslinkable polymers, such as e.g. polyurethanes, polyacrylates or polyolefins, and subsequent crosslinking. Such crosslinking products which are suitable as polymers can also be formed, for example, by reaction of the added crosslinking agents with polymeric anions optionally contained in the first conductive layer. The polymers serve above all to glue the first electrically conductive layer and adjacent part regions or layers of the layered structure. In a sufficient amount as an adhesive in a polymer layer, the polymers mentioned can convert this into an adhesive layer. The amount of adhesives can vary between the first part region and the further part region within the first electrically conductive layer.

The aliphatic hydrocarbon can be chosen from an alkane, an alkene, an alkyne or a mixture of at least two of these. The aliphatic hydrocarbon can be an acyclic or a cyclic hydrocarbon. The aliphatic hydrocarbon can be branched or unbranched in structure.

Preferably, the aliphatic hydrocarbon has a number of carbon atoms in a range of from 1 to 100, preferably in a range of from 2 to 50, or preferably in a range of from 3 to 20. Examples of aliphatic hydrocarbons are methane, ethane, propane, n-butane, n-pentane, n-hexane, n-heptane, ethene, propene, 1-butene, 2-butene, 1-pentene, 2-pentene, 1-hexene, 2-hexene, 3-hexene, 1-heptene, 2-heptene, 3-heptene, 4-heptene, ethyne, 1-propyne, 1-butyne, 1-pentyne, 1-hexyne, 1-heptyne or 1,2-butadiene.

The aromatic hydrocarbon can be chosen from the group consisting of benzene, toluene, xylene, trimethylbenzene, naphthalene, anthracene or a mixture of at least two of these. The aliphatic or aromatic hydrocarbons can preferably be used as solvents for further constituents in the production of the first electrically conductive layer.

The hydrocarbon having at least one functional group can be chosen from an aliphatic hydrocarbon having at least one functional group or an aromatic hydrocarbon having a functional group. The functional group can be a hydrophobic or a hydrophilic functional group. The functional group can be chosen from the group consisting of an ammonium group, a carboxylate group, a sulphate group, a sulphonate group, an alcohol group, a polyalcohol group, an ether group or a mixture of at least two of these. Preferably, the hydrocarbon having at least one functional group has a number of functional groups in a range of from 1 to 20, preferably in a range of from 1 to 10, or preferably in a range of from 1 to 5. The hydrocarbon having at least one functional group can be chosen from the group consisting of methanol, ethanol, butanol, propanol, phenol, acetone, γ-butyrolactone, N-methyl-2-pyrrolidone, acetonitrile, nitromethane, triethylamine, dimethylformamide, dimethylsulphoxide, ethylene carbonate, ethylene glycol monobutyl ether, dimethyl carbonate, propylene glycol methyl ether acetate, propylene glycol methyl ether acetate, rosemary oil, lavender oil, a turpentine oil, a camphor oil, and terpineol, sorbitol, xylitol, or a mixture of at least two of these.

The first electrically conductive layer can comprise the organic component in each case in a range of from 0.001 to 90 wt. %, preferably in a range of from 0.01 to 75 wt. %, or preferably in a range of from 0.05 to 50 wt. %, in each case based on the total weight of the first conductive layer.

The inorganic component can be chosen from the group consisting of a metal salt, a ceramic, a glass, a salt, an acid, a base, water or a combination or mixture of at least two of these. The inorganic component is preferably chosen from the group consisting of potassium, sodium or magnesium sulphate, potassium sodium or magnesium phosphate, potassium, sodium or magnesium sulphate, potassium, sodium or magnesium phosphate, aluminium oxide, aluminium chloride, aluminium sulphate, sodium citrate, potassium citrate, ammonium chloride, ammonium phosphate, ammonium sulphate, ammonium nitrate, a feldspar, a mica, a clay mineral, a garnet, silicon dioxide, for example in the form of a silica sol, hydrochloric acid, carbonic acid, sulphuric acid, nitric acid, nitrous acid, sodium hydroxide solution, potassium hydroxide solution, ammonia or a mixture of at least two of these.

The first electrically conductive layer can comprise the inorganic component in each case in a range of from 0.001 to 90 wt. %, preferably in a range of from 0.01 to 75 wt. %, or preferably in a range of from 0.05 to 50 wt. %, in each case based on the total weight of the first conductive layer.

The sum of the components listed above which the first electrically conductive layer comprises adds up to 100 wt. %.

The first electrically conductive layer can have any form and shape which the person skilled in the art would choose for an electrically conductive layer in a layered structure. The form of the first electrically conductive layer is preferably flat or film-like, or leaf material present as individual leaves. The first electrically conductive layer preferably has a first surface having an area in a range of from 0.1 to 10,000 $cm^2$, preferably in a range of from 0.5 to 5,000 $cm^2$, or preferably in a range of from 1 to 1,000 $cm^2$. The first electrically conductive layer overlaps the substrate layer at least in part on the first surface. Preferably, the first electrically conductive layer overlaps the first surface of the substrate layer in a range of from 1 to 100%, preferably in a range of from 5 to 95%, or preferably in a range of from 10 to 90%, based on the total area of the first surface of the substrate layer. The thickness of the first electrically conductive layer is preferably in a range of from 10 nm to 20 μm, or preferably in a range of from 50 nm to 10 μm, or preferably in a range of from 100 nm to 5 μm.

The first electrically conductive layer has at least one first part region and at least one further part region, Preferably, the first electrically conductive layer comprises the at least one first part region in a number in a range of from 1 to 100, preferably in a range of from 2 to 50, or preferably in a range of from 3 to 30. Furthermore preferably, the first electrically conductive layer comprises the at least one further part region in a number in a range of from 1 to 100, preferably in a range of from 2 to 50, or preferably in a range of from 3 to 30. Preferably, the first electrically conductive layer comprises the at least one first part region in a density in a range of from 1 to 10 first part regions per $cm^2$, preferably in a range of from 2 to 8 first part regions per $cm^2$, or preferably in a range of from 3 to 5 first part regions per $cm^2$. Preferably, the first electrically conductive layer comprises the at least one further part region in a density in a range of from 1 to 10 further part regions per $cm^2$, preferably in a range of from 2 to 8 further part regions per $cm^2$, or preferably in a range of from 3 to 5 first part regions per $cm^2$.

The at least one first and at least one further part regions can be arranged with respect to one another in the first conductive layer in any arrangement considered by the person skilled in the art to be appropriate for a layered structure. It is preferable for in each case at least one first part region to be adjacent to at least one further part region and to be in electrical contact with this. They can be adjacent directly or via a third part region which has an adequate electrical conductivity. An adequate electrical conductivity is to be understood as meaning an electrical conductivity which is at least as high as that of the at least one first part region or of the at least one further part region. The third part region can, for example, likewise comprise an electrically conductive polymer or alternatively or additionally a metal or graphite. The third part region can otherwise be constructed in just the same way as the first or the further part region. The metal can be chosen from the group consisting of silver, copper, gold, aluminium, tungsten, platinum, palladium, nickel, iron, chromium or a mixture of at least two of these.

At least one of the at least one first part regions is adjacent to the substrate layer. This can likewise be either by direct contact or via at least one intermediate layer, which can comprise either a third part region, or a layer which conducts virtually no electric current, such as, for example, a polymer layer, a paper layer, an adhesive layer or a combination of at least two of these. The at least one further part region can likewise be in direct or indirect contact with the substrate layer, or there can be at least one of the at least one first part regions between the substrate layer and the further part region. Different arrangements, as described above, can furthermore be effected for the at least one first and the at least one further part region. Thus, for example, at least one of the at least one further part region can be in contact with the substrate layer, and furthermore at least one second further part region can be separated from the substrate layer by a first part region.

The arrangement of the first to the further part regions can be in a regular pattern or randomized. The arrangement of the first to the further part regions can furthermore be in two dimensions or even in three dimensions. The shape of the part regions can be chosen from the group consisting of a triangular, a square, a rectangular, a round, an oval, a polygonal or a mixture of at least two of these. In a preferred embodiment of the layered structure, the arrangement of the first to the further part regions is in a two-dimensional pattern within the first electrically conductive layer. In a further preferred embodiment, the arrangement of the first to the further part regions is in a three-dimensional pattern within the first electrically conductive layer.

At least a part of the at least one first part region overlaps the first substrate layer. According to the invention, at least one of the at least one first part regions of the electrically conductive layer has a higher bonding strength to the substrate layer than to the at least one further part region. Preferably, the bonding strength of the first part region to the at least one further part region of the first conductive layer is in a range of from 1.01 to 50 times, or preferably in a range of from 1.1 to 30 times, or preferably in a range of from 1.1 to 20 times lower than the bonding strength between the at least one first part region of the first conductive layer and the substrate layer.

The different bonding strength of the at least one first part region to the substrate layer compared with its bonding strength to the at least one further part region can have various causes. One cause of the different bonding strength of the at least one first part region to the substrate layer compared with its bonding strength to the at least one further part region can be based on the fact that the first part region has a different material composition than the further part region. The different bonding strength of the first part region to the substrate layer compared with the bonding strength thereof to the further part region can be effected by a further layer of which the bonding strength is higher than the bonding strength between the at least one first part region and the at least one further part region being in contact with at least the at least one further part region.

In a further embodiment of the layered structure, at least a part of the at least one part region and if appropriate at least a part of the first part region is bonded to a structure, for example to a further layer within the layered structure, the further part region having a higher bonding strength to the further layer than to the at least one first part region.

In a further embodiment of the layered structure, at least a part of the at least one further part region can likewise overlap a part of the first surface of the substrate layer. Preferably, in this embodiment the bonding strength of the at least one first part region to the substrate layer differs from the bonding strength of the at least one further part region to the substrate layer. Preferably, the bonding strength of the first part region to the substrate layer is 1.01 to 50 times, or preferably 1.1 to 40 times, or preferably 1.1 to 30 times higher than the bonding strength of the further part region to the substrate layer. In a preferred embodiment of the layered structure, the at least one first part region has a higher content of adhesive, for example in the form of polymers as mentioned above, than the further part region. Different bonding strengths for example of the first and further part regions on the substrate layer can be achieved using the same composition of the electrically conductive compositions by means of different drying, such as, for example, a different temperature or drying at a different speed. The nature of the surface of the substrate layer has a further influence on the bonding strengths. The rougher the surface or the more hydrophilic the surface, the more strongly the electrically conductive composition applied adheres. Part regions of the same electrically conductive composition adhering at different strengths can be rendered possible in the electrically conductive layer in this manner.

The bonding strength between the at least one first part region to the at least one further part region of the first conductive layer is preferably in a range of from 0.01 to 10 $N/mm^2$, or preferably in a range of from 0.01 to 5 $N/mm^2$, preferably in a range of from 0.01 to 3 $N/mm^2$. The bonding strength between the at least one first part region to the substrate layer is preferably in a range of from 0.01 to 2 $N/mm^2$, or preferably in a range of from 0.02 to 1.2 $N/mm^2$, or preferably in a range of from 0.02 to 0.9 $N/mm^2$. The bonding strength between the at least one further part region of the first conductive layer to the substrate layer is preferably in a range of from 0.01 to 2 $N/mm^2$, or preferably in a range of from 0.01 to 1.2 $N/mm^2$, preferably in a range of from 0.02 to 0.9 $N/mm^2$. In a further embodiment, the bonding strengths of the first and further part regions in the adjacent region have a difference in the bonding strengths of at least 0.01 $N/mm^2$.

In a preferred embodiment of the layered structure, the layered structure comprises at least one of the following further layers:
c) a further electrically conductive layer which overlaps at least in part the substrate layer on the second surface;
d) a film of plastic which surrounds at least a part of the layered structure, preferably the entire layered structure.

The further electrically conductive layer can have any form and shape which the person skilled in the art would choose for an electrically conductive layer in a layered structure. The form of the further electrically conductive layer is preferably flat or film-like. The further electrically conductive layer preferably has a first surface having an area in a range of from 0.1 to 10,000 $cm^2$, preferably in a range of from 0.5 to 5,000 $cm^2$, or preferably in a range of from 1 to 1,000 $cm^2$. The further electrically conductive layer overlaps at least in part the substrate layer on the second surface. Preferably, the further electrically conductive layer overlaps the second surface of the substrate layer in a range of from 1 to 100%, preferably in a range of from 5 to 95%, or preferably in a range of from 10 to 90%, based on the total area of the second surface of the substrate layer. The second surface of the substrate layer preferably has the same spread and dimensions as described for the first surface of the substrate layer. The thickness of the further electrically conductive layer is preferably in a range of from 10 nm to 20 μm, or preferably in a range of from 50 nm to 10 μm, or preferably in a range of from 100 nm to 5 μm.

The further electrically conductive layer preferably comprises the same materials as the first electrically conductive layer.

In a preferred embodiment of the further electrically conductive layer, the further electrically conductive layer, just as the first electrically conductive layer, has at least one first part region and at least one further part region. The materials, properties and form and arrangement of the at least one first part region and the at least one further part region of the further electrically conductive layer are preferably the same as those of the first and further part regions of the first conductive layer. In this context, it is to be taken into account that the arrangement of the first and the further electrically conductive layer is mirror-inverted with respect to the substrate layer and is on the second surface of the substrate layer.

In a further preferred embodiment of the further electrically conductive layer, the further electrically conductive layer comprises the composition and properties of the at least one first part region of the first electrically conductive layer.

The further electrically conductive layer can be connected directly to the second surface of the substrate layer or can be spaced from it at least in part by a further intermediate layer of the layered structure. The further intermediate layer can be, for example, a layer chosen from the group consisting of an adhesive layer, a paper layer, a glass layer, a metal layer, at least one first part region of the first conductive layer, at least one further part region of the first conductive layer or a combination of at least two of these. Polymers such as have been described previously as adhesives can be used above all as constituents of adhesive layers. The metal layer can preferably comprise a metal chosen from the group consisting of silver, copper, gold, aluminium, tungsten, platinum, palladium, nickel, iron, chromium or a mixture of at least two of these. Preferably, at least a first part of the further electrically conductive layer is spaced from the second surface of the substrate layer by a part of a first or a further part region of the first electrically conductive layer. Furthermore, at least one further part of the further electrically conductive layer is connected directly to the second surface of the substrate layer. The first part of the further electrically conductive layer preferably comprises a range of from 0 to 50%, or preferably a range of from 5 to 40%, or preferably a range of from 10 to 30%, based on the total surface with which the further electrically conductive layer overlaps the substrate layer. The further part of the further electrically conductive layer preferably comprises a range of from 50 to 100%, or preferably a range of from 60 to 95%, or preferably a range of from 70 to 90%, based on the total surface with which the further electrically conductive layer overlaps the substrate layer.

The film of plastic can comprise any material and have any form which the person skilled in the art regards as suitable for a film of plastic in a layered structure. Preferably, the film of plastic is chosen from a polymer. The polymer is particularly preferably an insulator which conducts no or virtually no electric current. The polymer is preferably chosen from the group consisting of a polyethylene, a polyethylene terephthalate, a polyvinyl alcohol, a polyvinylpyrrolidone, a polyvinyl chloride, a polyvinyl acetate, a polyvinyl butyrate, a polyacrylic acid ester, a polyacrylic acid amide, a polymethacrylic acid ester, a polymethacrylic acid amide, a polymethyl methacrylate, a polyethylene glycol, a polyacrylonitrile, a styrene/acrylic acid ester copolymer, a vinyl acetate/acrylic acid ester copolymer and an ethylene/vinyl acetate copolymer, a polybutadiene, a polyisoprene, a polystyrene, a polyether, a polyester, a polycarbonate, a polyurethane, a polyamide, a polyimide, a polysulphone, a melamine-formaldehyde resin, an epoxy resin, a silicone resin and a cellulose or a mixture of at least two of these. A possible polymer is furthermore also one which is produced by addition of crosslinking agents, such as, for example, melamine compounds, masked isocyanates or functional silanes, such as e.g. 3-glycidoxypropyltrialkoxysilane, tetraethoxysilane and tetraethoxysilane hydrolysate, or crosslinkable polymers, such as e.g. polyurethanes, polyacrylates or polyolefins, and subsequent crosslinking. The polymer is particularly preferably chosen from the group consisting of polyester, polyvinyl chloride, polyvinyl acetate, polyethylene, acrylonitrile/butadiene/styrene, polystyrene, polycarbonate, polymethyl methacrylate, polyethylene glycol or at least two of these. It is preferable for the polymer or the film of plastic to be transparent.

The film of plastic can overlap, in each case at least in part, the layered structure on the side of the first surface of the substrate layer, on the side of the second surface of the substrate layer or on both sides of the substrate layer. The film of plastic overlaps the first surface of the substrate layer preferably in a range of from 10 to 100%, or preferably in a range of from 30 to 100%, or preferably in a range of from 60 to 100%, or preferably in a range of from 60 to 96%, in each case based on the total area of the first surface of the substrate layer. The film of plastic overlaps the second surface of the substrate layer preferably in a range of from 10 to 100%, or preferably in a range of from 30 to 100%, or preferably in a range of from 60 to 100%, or preferably in a range of from 60 to 96%, in each case based on the total area of the second surface of the substrate layer. Preferably, the film of plastic overlaps the layered structure on both sides of the substrate layer. Particularly preferably, the film of plastic surrounds the entire layered structure. The film of plastic can moreover surround the layered structure beyond the surfaces thereof. Preferably, the film of plastic protrudes from the first or the further or both surfaces in a range of from 1 to 20%, preferably in a range of from 2 to 15%, or preferably in a range of from 3 to 10%, based on the particular total surface of the first or the second surface of the layered structure. In a preferred embodiment of the layered structure, the film of plastic protrudes from both surfaces of the layered structure. Particularly preferably, the film of plastic encloses the layered structure completely. Preferably, the layered structure is enclosed by a peripheral border of film of plastic.

As already described above, the film of plastic can be bonded with a different strength to the first and further part regions of the first or second electrically conductive layers. The film of plastic can be connected directly to the part regions, or can be connected to these via one or more further layers, such as, for example, an adhesive layer. The bonding strength of the film of plastic to the electrically conductive layer is preferably lower at least to the at least one first part region than to the at least one further part region of the electrically conductive layer. The bonding strength of the film of plastic to the at least one further part region of the first conductive layer is preferably in a range of from 0.01 to 10 N/mm$^2$, or preferably in a range of from 0.02 to 9 N/mm$^2$, or preferably in a range of from 0.05 to 8 N/mm$^2$. The bonding strength of the film of plastic to the at least one first part region of the first conductive layer is preferably in a range of from 0.1 to 5 N/mm$^2$, or preferably in a range of from 0.2 to 8 N/mm$^2$, preferably in a range of from 0.03 to 5 N/mm$^2$. In one embodiment, the bonding strengths of the first and further part regions in the adjacent region have a difference in the bonding strengths of at least 0.01 N/mm$^2$.

Preferably, the bonding strength of the film of plastic to the at least one further part region of the first conductive layer is in a range of from 2 to 50 times, or preferably in a range of from 3 to 30 times, or preferably in a range of from 5 to 20 times higher than the bonding strength between the film of plastic and the at least one first part region of the first conductive layer. The same preferably also applies to the bonding ratios between the film of plastic and the further conductive layer and at least one part region thereof.

In a preferred embodiment of the layered structure, the further electrically conductive layer is arranged at least in part in or outside the plane of the second surface on the side of the second surface of the substrate layer, the first electrically conductive layer and the further electrically conductive layer being connected electrically by a contact through the substrate layer at least in one contact region.

The contact region can have any form which the person skilled in the art would choose for the electrical contacting of the first electrically conductive layer with the further electrically conductive layer. The contact region preferably comprises a passage in the form of a hole through the substrate layer. The contact region furthermore preferably comprises a material which renders possible an electrical contact between the first and the further electrically conductive layer.

The passage in the form of the hole through the substrate layer can have various shapes and various sizes. Preferably, the hole has a shape chosen from the group consisting of a circle, an oval, a square, a rectangle, a polygon, a star, a five- or six-cornered honeycomb or a combination of at least two of these. Particularly preferably, the hole has the shape of a star. The passage preferably has a continuous substrate-connecting area which extends between the first surface and the second surface of the substrate layer. The continuous substrate-connecting area is preferably arranged perpendicularly between the first and the second surface of the substrate layer. The continuous substrate-connecting area adjacent to the passage preferably has an area in a range of from 0.1 to 1,000 mm$^2$, preferably in a range of from 0.1 to 100 mm$^2$, or preferably in a range of from 0.1 to 50 mm$^2$.

The material which renders possible an electrical contact between the first and the further electrically conductive layer preferably comprises a component which can conduct electric current. Preferably, the material comprises a component chosen from the group consisting of a metal, an electrically conductive polymer, a cermet, graphite or a mixture of at least two of these. Preferably, the material comprises an electrically conductive polymer. Furthermore preferably, the electrically conductive polymer is chosen from the group consisting of a polypyrrole, polythiophene, polyaniline, polyacetylene, polyphenylene and poly(p-phenylene-vinylene) or a mixture of at least two of these. Particularly preferably, the material is constructed in just the same way as the at least one first or the at least one further part region. The metal can be chosen from the group consisting of silver, copper, gold, aluminium, tungsten, platinum, palladium, nickel, iron, chromium or a mixture of at least two of these. The cermet preferably comprises a ceramic component and a metallic component. Preferably, the ceramic component is chosen from the group consisting of aluminium oxide ($Al_2O_3$), magnesium oxide (MgO), zirconium oxide ($ZrO_2$), yttrium oxide ($Y_2O_3$), aluminium titanate ($Al_2TiO_5$), a feldspar $(Ba,Ca,Na,K,NH_4)(Al,B,Si)_4O_8)$ or a mixture of at least two of these. Preferably, the metallic component is chosen from the group consisting of platinum, palladium, iridium, niobium, molybdenum, titanium, cobalt, zirconium, rhodium, ruthenium, chromium, tantalum, tungsten, a titanium alloy, a tantalum alloy, a tungsten alloy or a mixture of at least two of these.

The material which renders possible an electrical contact between the first and the further electrically conductive layer extends within the passage at least to a part of the continuous substrate-connecting area of the passage. Preferably, the material which renders possible an electrical contact between the first and the further electrically conductive layer extends over a part of the continuous substrate-connecting area in a range of from 5 to 100%, or preferably in a range of from 10 to 100% or in a range of from 50 to 100%, in each case based on the total area of the continuous substrate-connecting area. The material which renders possible an electrical contact between the first and the further electrically conductive layer fills the passage preferably in a range of from 10 to 100%, or preferably in a range of from 30 to 100%, or preferably in a range of from 50 to 100%, based on the total volume of the passage. The total volume of the passage results from the height of the substrate layer at the point of the passage multiplied by the passage area at the plane of the first surface of the substrate layer, multiplied by the passage area at the plane of the second surface of the substrate layer.

In a preferred embodiment of the layered structure, the first electrically conductive layer and the further electrically conductive layer overlap at least in a part of the contact region. According to the application, overlapping is to be understood as meaning that at least a part of the first electrically conductive layer and a part of the further electrically conductive layer are in each case in the plane of the first and the second surface which are arranged perpendicularly to one another. Furthermore preferably, at least a part of the first electrically conductive layer and of the further electrically conductive layer overlap outside the contact region.

The contact within the contact region preferably comprises at least one further part region of the first electrically conductive layer. Furthermore preferably, the contact comprises at least one first and at least one further part region of the first electrically conductive layer. Preferably, the contact alternatively or additionally comprises at least one further part region of the first electrically conductive layer and at least one first or at least one further part region of the further electrically conductive layer.

In a further preferred embodiment of the layered structure, the electrical contact of the first electrically conductive layer with the further electrically conductive layer in the contact region is breakable.

A further preferred embodiment of the layered structure is that wherein the breaking of the electrical contact takes place under a mechanical or chemical influence. In the context of the present invention, breakable or breaking is understood as meaning that on the basis of a physical change, such as, for example, a mechanical separation, or a chemical modification in at least a part of the electrical contact between the first electrically conductive layer and the further electrically conductive layer, at least the electrical conductivity of the contact in the contact region is changed. The consequence of this is that the resistance between the first electrically conductive layer and the further electrically conductive layer is increased due to the breaking. Preferably, on breaking of the electrical contact the electrical resistance over the contact changes by an amount in a range of from 10Ω to 100 kΩ, or preferably in a range of from 20Ω to 500 kΩ, or preferably in a range of from 30Ω to 3 MΩ compared with the resistance before the breaking of the contact. The measurements of the resistance values in this context should be performed under comparable conditions, as is described under the measurement methods. During the physical change, for example, the contact can be reduced or separated by mechanical influence. This can be effected, for example, by mechanical influences such as cutting, sawing, tearing or a combination of at least two of these, at least on one layer of the layered structure. During chemical influence, the contact can likewise be reduced or separated. A chemical influence is, for example, changes in the pH or chemical dissolving out of a constituent from one of the electrically conductive layers in the contact region. These mechanical or chemical influences can occur, for example, during a manipulation of the layered structure if one of the layers of the layered structure, for example, is treated with chemicals, or is treated by mechanical influences, such as cutting, sawing, tearing or a combination of at least two of these. In the event in particular of an attempt at manipulation of a layered structure, such as, for example, an identity card, thermoprints or a passport, mechanical or chemical influences are exerted on at least one layer of the layered structure. The manipulation can be detected by comparison of the resistance values of the layered structure before and after the manipulation, as is explained further in the following.

An embodiment of the layered structure wherein at least a part of the at least one further part region contacts the at least one further electrically conductive layer in the contact region is furthermore preferred. Preferably, the further electrically conductive layer also contacts the substrate layer on the second surface. Furthermore preferably, the bonding strength of the further electrically conductive layer to the substrate layer is higher than to the further part region of the first conductive layer.

The contacting of at least one further part region of the first electrically conductive layer with the further electrically conductive layer has the effect that the contact between the two electrically conductive layers is preferably broken in the contact region when a mechanical or chemical influence is exerted on one of the two layers. The at least one further part region of the first conductive layer is preferably in contact with a first part region of the first electrically conductive layer. Under an action of a mechanical influence on at least one of the layers chosen from the group consisting of the first electrically conductive layer, the further electrically conductive layer, the substrate layer, the layer of plastic or a combination of at least two of these, the resistance of the layered structure is preferably changed. This is preferably effected by the contact in the contact region being broken. Due to the different bonding strengths between the at least one first part region of the first electrically conductive layer or between the further electrically conductive layer to the substrate layer than to at least a further part region of the first electrically conductive layer, the contact between the first and the further part region of the first electrically conductive layer or between the further part region of the first conductive layer and the further electrically conductive layer is preferably broken.

In a preferred embodiment of the layered structure, a further substrate layer overlaps at least in part the first electrically conductive layer or the further electrically conductive layer. The materials, the form and size and the bonding strengths to the electrically conductive layers of the further substrate layer are preferably the same as those of the first substrate layer. The further substrate layer serves above all for stability of the layered structure.

In another preferred embodiment of the layered structure, it is preferable for a third electrically conductive layer to be connected to the first electrically conductive layer or the further electrically conductive layer.

In a further preferred embodiment of the layered structure, the layered structure has at least one further contact region. The further contact region is preferably connected electrically to the first contact region. Furthermore preferably, the layered structure has further contact regions in a range of from 2 to 20, or preferably in a range of from 2 to 15, or preferably in a range of from 2 to 10. Preferably, all the contact regions are connected to one another electrically.

In a preferred embodiment of the layered structure, the first contact region is connected via at least a part of the at least one first part region to the at least one further contact region. Furthermore preferably, all the contact regions are connected via at least a part of the at least one first part region within each case an adjacent contact region. Preferably, all the contact regions are connected with one another in series via at least a part of the at least one first part region.

An embodiment of the layered structure wherein at least a part of the first electrically conductive layer or the second electrically conductive layer can be connected to a capacitor is furthermore preferred. The capacitor preferably comprises at least an anode and a cathode, of which the anode or the cathode can be connected to the first electrically conductive layer on the one side of the contact region and the cathode or anode respectively can be connected to the other side of the contact region, so that the anode and cathode of the capacitor are separated by the contact region. By means of the voltage which the capacitor can provide, a set resistance of the layered structure can be determined with a measuring unit. If a manipulation takes place on the layered structure in which the contact is preferably broken, the electrical values for the capacitance and/or resistance change. By the change in resistance from the set resistance to the actual resistance and/or the set capacitance to the actual capacitance, a manipulation of the layered structure can be determined. After a manipulation, the actual resistance differs from the set resistance preferably by at least 40%. After a manipulation, the actual capacitance differs from the set capacitance preferably by at least 40%.

In a preferred embodiment of the layered structure, at least one of the regions chosen from the group consisting of the further electrically conductive layer, the third electrically conductive layer, the contact or at least two of these comprises an electrically conductive polymer. Preferably, the further electrically conductive layer, the third electrically conductive layer and the contact comprise the same electrically conductive polymer as the first electrically conductive layer. Furthermore or alternatively, the further electrically conductive layer can comprise further electrically conductive components, such as, for example, a metal or graphite, as already mentioned.

In a preferred embodiment of the layered structure, the conductive polymer is a polythiophene. A particularly important polythiophene which is used industrially is poly-3,4-(ethylene-1,2-dioxy)thiophene, often also called poly-(3,4-ethylenedioxythiophene), which in its oxidized form has very high conductivities and is described, for example, in EP-A 339 340. An overview of numerous poly(alkylenedioxythiophene) derivatives, in particular poly(3,4-ethylenedioxythiophene) derivatives, and their monomer units, syntheses and uses is given by L. Groenendaal, F. Jonas, D. Freitag, H. Pielartzik & J. R. Reynolds, Adv. Mater. 12, (2000) 481-494.

To compensate the positive charge, if this is not already done by the optionally sulphonate- or carboxylate-substituted and therefore negatively charged radicals R, the cationic polythiophenes require anions as counter-ions.

Possible counter-ions are monomeric or polymeric anions, the latter also being called polyanions in the following.

Polymeric anions can be, for example, anions of polymeric carboxylic acids, such as polyacrylic acids, polymethacrylic acid or polymaleic acids, or polymeric sulphonic acids, such as polystyrenesulphonic acids and polyvinylsulphonic acids. These polycarboxylic and -sulphonic acids can also be copolymers of vinylcarboxylic and vinylsulphonic acids with other polymerizable monomers, such as acrylic acid esters and styrene.

The anion of polystyrenesulphonic acid (PSS), as a counter-ion, is particularly preferred as the polymeric anion.

The molecular weight of the polyacids which supply the polyanions is preferably 1,000 to 2,000,000, particularly preferably 2,000 to 500,000. The polyacids or their alkali metal salts are commercially obtainable, e.g. polystyrenesulphonic acids and polyacrylic acids, or can be prepared by known processes (see e.g. Houben Weyl, Methoden der organischen Chemie, vol. E 20 Makromolekulare Stoffe, part 2, (1987), p. 1141 et seq.).

Alternatively, monomeric anions can also be employed. Monomeric anions which are used are, for example, those of C1-C20-alkanesulphonic acids, such as methane-, ethane-, propane-, butanesulphonic acid or higher sulphonic acids, such as dodecanesulphonic acid, of aliphatic perfluorosulphonic acids, such as trifluoromethanesulphonic acid, perfluorobutanesulphonic acid or perfluorooctanesulphonic, of aliphatic C1-C20-carboxylic acids, such as 2-ethylhexylcarboxylic acid, of aliphatic perfluorocarboxylic acids, such as trifluoroacetic acid or perfluorooctanoic acid, and of aromatic sulphonic acids optionally substituted by C1-C20-alkyl groups, such as benzenesulphonic acid, o-toluenesulphonic acid, p-toluenesulphonic acid or dodecylbenzenesulphonic acid, and of cycloalkanesulphonic acids, such as camphorsulphonic acid, or tetrafluoroborates, hexafluorophosphates, perchlorates, hexafluoroantimonates, hexafluoroarsenates of hexachloroantimonates. The anions of p-toluenesulphonic acid, methanesulphonic acid or camphorsulphonic acid are particularly preferred among the monomeric anions.

In a further preferred embodiment of the layered structure, at least one of the regions chosen from the group consisting of the first electrically conductive layer, the further electrically conductive layer, the third electrically conductive layer, or at least two of these has an electrical resistance in a range of from 2Ω to 40 kΩ, preferably in a range of from 2Ω to 25 kΩ, or preferably in a range of from 5 to 15 kΩ. These ranges apply under standard conditions at a temperature of 25° C. under a pressure of 1013 mbar. The information on the determination of the electrical resistance of the layers is to be found in the measurement methods.

In a further embodiment of the layered structure, at least one of the layers chosen from the group consisting of the first substrate layer, the further substrate layer, the third substrate layer or a combination of at least two of these comprises a substance chosen from the group consisting of a polymer, a glass, a ceramic or a combination of at least two of these.

The possible materials, forms and sizes which have already been stated above for the first substrate layer are also preferred for the further and the third substrate layer.

In a further preferred embodiment of the layered structure, at least one of the layers chosen from the group consisting of the first substrate layer, the further substrate layer, the third substrate layer or a combination of at least two of these has an electrical resistance of more than 1 MΩ, preferably of more than 2 MΩ, or preferably of more than 5 MΩ. The information on the determination of the electrical resistance of the layers is to be found in the measurement methods.

The present invention also provides a process for the production of a layered structure, comprising the process steps:
i) provision of a first substrate layer, wherein the first substrate layer has a first surface and a second surface;
ii) application of a first electrically conductive composition to at least a part of the first surface or the second surface of the first substrate layer to form at least a first part region of an electrically conductive layer, wherein the first electrically conductive composition comprises an electrically conductive polymer;
iii) application of a further electrically conductive composition to at least a part of the regions chosen from the group consisting of the first surface of the substrate layer, the first part region or both, to form at least one further part region of the electrically conductive layer, wherein the further electrically conductive composition comprises an electrically conductive polymer;
iv) contacting of at least a part of the at least one first part region with the further electrically conductive composition to form the electrically conductive layer;
wherein the at least one first part region has a higher bonding strength to the substrate layer than to the at least one further part region.

All the information on the first substrate layer, the first electrically conductive layer, the at least one first part region and the at least one further part region which has been given above for the layered structure is also to be applied to the process.

The provision of the first substrate layer can be effected in any manner which the person skilled in the art would envisage for the provision of a substrate layer for the production of a layered structure. Thus, the substrate layer can be provided, for example, as a paper layer or polymer layer. The paper layer or polymer layer can be provided, for example, as roll goods. Alternatively, the provision can take place in the form of individual leaves or films of the paper layer or polymer layer. If the substrate layer is provided as glass or ceramic, the substrate layer is preferably provided as plates or sheets.

The application can be any type of application of a composition to a substrate layer which the person skilled in the art would choose for the production of a layered structure according to the invention. In this context, the substrate layer is preferably overlapped at least in part with the electrically conductive composition. Preferably, the application can be a deposition of the electrically conductive composition or a dipping into the electrically conductive composition or a combination of the two. The application by deposition of the electrically conductive composition can be carried out e.g. by spin coating, dipping, impregnation, pouring, dripping on, spraying, misting on, knife coating, brushing or printing, for example via a metering pump or an ink-jet, screen, gravure, offset or tampon printing on the substrate layer. Preferably, the composition is applied to the substrate layer via a metering pump, an inkjet printing, a screen printing or a gravure printing. Preferably, the electrically conductive composition is applied in a wet film thickness of from 0.5 μm to 250 μm, preferably in a wet film thickness of from 2 μm to 50 μm.

According to the invention, deposition is understood as meaning that the electrically conductive composition, preferably also called liquid or printing composition, used for the application is applied by means of an aid to the surface to be overlapped. This can be effected by various aids. Thus, the printing composition used for the application or overlapping can be misted through a nozzle, sprayed or deposited through a slit die on to the substrate layer. Further methods are curtain pouring and spin coating. Alternatively or in addition, the printing composition used for the application or overlapping can be applied to or printed on to the surface, for example, via a roll or roller. Misting or spraying processes which are known are, for example, the micro-metering or inkjet printing via a nozzle. In this procedure, pressure can be exerted on the printing composition used for the application or overlapping, or the printing composition used for the application is simply applied by dripping through the nozzle on to the surface.

A screen printing process or a gravure printing process can preferably be used as the printing process. In the screen printing process, a screen made of a material which is as dimensionally stable as possible, such as wood; metal, preferably steel; a ceramic or a plastic, and is of chosen mesh width is arranged on the or over the object to be overlapped, such as the various layers here. The printing composition used for the application or overlapping is applied to this screen and pressed through the meshes using a doctor blade. In this context, on the basis of a pattern in the screen a different amount of printing composition used for the application or overlapping can be applied at different points. Due to the geometry and arrangement of the meshes, either a uniform film of the printing composition used for the overlapping can thus be applied, or regions with no or little printing composition used for the application can alternate with regions with a large amount of printing composition used for the application. Preferably, a uniform film of the printing composition used for the overlapping is transferred to the surface. The screen meshes can also be partially closed by appropriately applied materials (copying layers, screen printing templates), so that the printing composition is transferred to the substrate only in defined regions with open meshes, in order thus, for example, to obtain a defined structure, such as a pattern. Instead of screens, thin films having defined openings (stencil) can furthermore also be used for the overlapping with the printing composition. Alternatively, the tampon printing process can be used, which provides, for example, a surface transferring the printing composition with the structured printing composition used for the overlapping, which is printed on to the surface to be coated or rolled over it.

Depending on the configuration of the nozzle or roll or roller and the viscosity and polarity of the printing composition used for the overlapping, layers of different thickness can be applied to the desired surface of the substrate layer. Preferably, the layer applied during the application or overlapping is applied with a thickness in a range of from 0.5 to 100 μm, preferably in a range of from 1 to 50 μm, particularly preferably in a range of from 2 to 30 μm. The thickness of the layer applied during the application is called wet layer thickness in the following. The wet layer thickness depends on the particular material which is applied during the overlapping. The wet layer thickness is measured directly after the overlapping step.

During dipping, for example, the surface to be coated is drawn through a bath containing the printing composition used for the application. Alternatively, the surface can also be simply dipped into the printing composition used for the application and drawn out again, as is practised during dip-coating. Different thicknesses of the coating can be achieved during the application by dipping several times. The thickness of the coating moreover depends on the choice of printing composition used for the application, as already mentioned above. In this manner, wet layer thicknesses of the particular coating in a range between from 0.5 to 100 μm, preferably a range of from 1 to 50 μm, particularly preferably in a range of from 2 to 30 μm can be achieved during the application. It is also conceivable to carry out a combination of the deposition and dipping process.

In one embodiment, the application of the printing composition used is carried out through an application opening provided over the particular surface of the layer to be overlapped. In this context the application opening is preferably connected to the surface via the printing composition used for the application. This process, also known as micro-metering, has the particular property that by this means it is rendered possible to apply different thicknesses of the overlapping coating to objects, such the substrate layer here, in a simple manner. The application opening can have any conceivable shape and size. It can be, for example, an application opening having a shape chosen from the group of round, oval, angular and star-shaped or combinations of these. The application opening can have an area of from 10 nm to 1 mm, preferably from 100 nm to 0.5 mm, particularly preferably from 100 nm to 100 μm. Preferably, the printing composition used for the application is applied to the surface through the nozzle with the aid of a pressure in a range of from 2,000 to 10,000 mbar, preferably in a range of from 2,500 to 5,000 mbar, particularly preferably in a range of from 3,000 to 4,000 mbar. By the connecting of the printing composition used for the overlapping to the surface of the particular layer to be overlapped during application to the surface of the printing composition used for the overlapping, tearing off of the printing composition used for the application on the surface can be avoided. By this means a very homogeneous film can be applied to the surface.

Preferably, the application is carried out by means of a screen printing process or a gravure printing process, preferably from roll to roll. In a preferred embodiment of the process, during the printing the printing composition is applied in the form of the electrically conductive composition by a screen or a printing cylinder. The screen preferably comprises a frame of steel or high-grade steel. A grid or screen which is likewise preferably made of high-grade steel wires or high-strength synthetic fibres is preferably arranged in the frame.

In a preferred embodiment of the process, the screen has a mesh width in a range of from 1 to 300 μm, preferably a range of from 2 to 200 μm, or preferably in a range of from 3 to 90 μm. This in each case corresponds to a mesh number of from approx. 70 to 635 mesh, or from approx. 100 to 500 mesh, or from approx. 200 to 400 mesh, where mesh corresponds to the unit mesh wires/inch or mesh wires/2.54 cm. In the case of application by means of screen printing, any commercially available doctor blade can be used as the doctor blade. Preferably, the doctor blade comprises a plastic. Preferably, the doctor blade has a doctor blade hardness in a range of from 40 to 80 Shore A. The printing composition preferably has a viscosity in a range of from 100 to 50,000 mPa*s, or preferably in a range of from 500 to 50,000 mPa*s.

At least one of steps i) to iii) is preferably carried out by printing by means of a liquid printing composition in the form of the first or the further electrically conductive composition. The printing composition is particularly preferably a dispersion. The dispersion comprises the electrically conductive polymer preferably as a solid. The first or the further electrically conductive composition comprises the electrically conductive polymer preferably in an amount in a range of from 0.1 to 20 wt. %, preferably in a range of from 0.3 to 10 wt. %, or preferably in a range of from 0.5 to 5 wt. %, based on the total weight of the particular printing composition. Furthermore, the first electrically conductive composition or the further electrically conductive composition, which are called merely first or further printing compositions in the following, or both can comprise various further components. The further components are preferably chosen from the group consisting of a binder, a solvent, a cross-linking agent, other additives or a mixture of at least two of these. Binders which can be used are, for example, polyurethane, polyacrylates, polyester, polyvinyl alcohols, polysulphones or a mixture of at least two of these. The solvent is preferably chosen from the group consisting of dimethylsulphoxide (DMSO), ethylene glycol, N-methyl-2-pyrrolidone (NMP), ammonia, water, an alcohol, such as, for example, ethanol, isopropanol or hexanol, or a mixture of at least two of these. The crosslinking agent can be, for example, a silane. The further additives can be chosen from the group consisting of nonionic surfactants, such as, for example, polyalkylene glycol ethers or alkyl polyglucosides, ionic surfactants, such as, for example, alkyl carboxylates, alkylbenzenesulphonates or alkanesulphonates, silicone-containing surface additives, such as are obtainable, for example, under the trade name Byk®-011 to Byk®-9077 from Byk-Chemie GmbH Wesel, or a mixture of at least two of these. The further components can furthermore also comprise substances which have been listed above for the first electrically conductive layer.

The first or further printing composition comprises the binder preferably in an amount in a range of from 0.1 to 25 wt. %, preferably in a range of from 0.5 to 15 wt. %, or preferably in a range of from 0.5 to 10 wt. %, based on the total amount of the particular printing composition. The first or further printing composition comprises the solvent in an amount in a range of from 20 to 99 wt. %, preferably in a range of from 30 to 97 wt. %, or preferably in a range of from 50 to 95 wt. %, based on the printing composition. The first or further printing composition comprises the crosslinking agent in an amount in a range of from 0.05 to 0.5 wt. %, preferably in a range of from 0.1 to 0.4 wt. %, or preferably in a range of from 0.15 to 0.3 wt. %, based on the printing composition. The first or further printing composition comprises the other additives in an amount in a range of from 0.1 to 1 wt. %, preferably in a range of from 0.15 to 0.5 wt. %, or preferably in a range of from 0.2 to 0.3 wt. %, based on the printing composition.

The first or further printing composition preferably has a viscosity in a range of from 10 to 60 mPa*s.

The first electrically conductive composition is applied in step i) of the process at least to a part of the first surface of the substrate layer to form a first part region of the first electrically conductive layer. The further electrically conductive composition can be applied in step iii) either to a part of the first surface of the substrate layer or to at least a part of the first part region. The contacting of at least a part of the at least one first part region with the further electrically conductive composition to form the first electrically conductive layer can preferably be carried out by direct contacting of the first electrically conductive composition with the second electrically conductive composition. Alternatively or in addition, a further electrically conductive material can be introduced between the first electrically conductive composition and the further electrically conductive composition, as has already been described for the layered structure. After steps ii) or iii), a heat treatment, in the form of a drying, of the substrate layer with the electrically conductive compositions which have been applied can be carried out. In step ii) or step iii), a heat treatment preferably takes place at a temperature in a range of from 40 to 200°, preferably in a range of from 45 to 180°, or preferably in a range of from 50 to 160°. The heat treatment preferably takes place for a period in a range of from 1 to 120 min, preferably in a range of from 5 to 100 min, or preferably in a range of from 10 to 80 min. The curing or heat treatment can be carried out, for example, by employing radiation or convection. Preferred processes for the curing or heat treatment are infrared radiation, UV radiation, hot air or a treatment in a drying cabinet or a combination of at least two of these. Preferably, the heat treatment is carried out by means of infrared radiation or hot air.

The first electrically conductive composition differs from the further electrically conductive composition preferably by the content of adhesive polymer, called binder as above. Preferably, the first electrically conductive composition and the further electrically conductive composition comprise a polymer chosen from the group consisting of a polyurethane, a polyacrylate or a mixture of these. Preferably, the first electrically conductive composition comprises this polymer in a range of from 0 to 10 wt. %, or preferably in a range of from 0 to 5 wt. %, or preferably in a range of from 0 to 3 wt. %, based on the total weight of the first electrically conductive composition. Preferably, the further electrically conductive composition comprises the polymer in a range of from 0.5 to 25 wt. %, or preferably in a range of from 1 to 25 wt. %, or preferably in a range of from 2 to 25 wt. %.

In a preferred embodiment, the at least one further part region and/or the at least one first part region are overlapped at least in part by a layer of plastic. The bonding strength of the layer of plastic to the at least one further part region is preferably a higher than to the at least one first part region.

In a preferred embodiment of the process, at least one of the following steps is carried out before or after step ii):
  v) application of a third electrically conductive composition to at least a part of the second surface of the substrate layer to form a further electrically conductive layer;
  vi) application of a third electrically conductive composition to at least a part of a further substrate layer to form a third electrically conductive layer;
  vii) production of a contact between the first electrically conductive layer and the further electrically conductive layer in at least one contact region.

In a further preferred embodiment of the process, the production of a contact in step v) comprises the following steps:
  v)a) formation of a hole at least through the first substrate layer;
  v)b) introduction of the further electrically conductive composition into at least a part of the hole, so that at least one first part region of the first conductive layer and the further electrically conductive layer are connected electrically by the electrically conductive composition.

The hole, which can also be called a passage, can be produced by any tool which serves to produce a hole in the substrate layer. Preferably, the hole is stamped out or cut out, for example by laser. If parts of the first electrically conductive layer are already applied at the point at which the hole is to be produced, these are preferably also stamped out. Preferably, the stamping tool is a steel stamp. The size, form and spread of the hole correspond to the information already given for the layered structure.

The introduction of the further electrically conductive composition is preferably carried out by a printing process such as has already been described above for the application of the first electrically conductive composition. Particularly preferably, the further electrically conductive composition is dripped into the hole via a nozzle, so that a preferably convex closure is formed over the surface, in order to keep the material shrinkage as low as possible during the drying process.

In a preferred embodiment of the process, the first conductive layer or the further electrically conductive layer is connected to a further substrate layer via a third electrically conductive layer by means of the electrically conductive composition. The third electrically conductive composition preferably comprises the same materials as the first or the further composition, also called first or further printing composition.

In a preferred embodiment of the process, the substrate layer is a dielectric.

In a further preferred embodiment of the process, the at least one first part region of the first electrically conductive layer has an active connection to the contact. Preferably, at least a part of the first part region of the first electrically conductive layer is a part of the contact.

The process wherein at least one of the regions chosen from the group consisting of the further electrically conductive layer, the third electrically conductive layer or both comprises an electrically conductive polymer is preferred.

The compositions of the further electrically conductive layer and of the third electrically conductive layer are preferably identical to that of the first electrically conductive layer, as described above.

In a further preferred embodiment of the process, the conductive polymer is a polythiophene. The amounts of thiophene are preferably the same as stated above for the layered structure.

In a preferred embodiment of the process, at least one of the regions chosen from the group consisting of the first electrically conductive layer, the further electrically conductive layer, the third electrically conductive layer or at least two of these has an electrical resistance in a range of from $2\Omega$ to $40\ k\Omega$, preferably in a range of from $3\Omega$ to $20\ k\Omega$, or preferably in a range of from 5 to $15\ k\Omega$. The information on the determination of the electrical resistance of the layers is to be found in the measurement methods.

The process wherein at least one of the substrate layers comprises a substance chosen from the group consisting of a paper, a ceramic, a polymer or a combination of at least two of these is preferred. The configuration of the various materials and the size and form of the at least one substrate layer are preferably chosen from those which have already been stated for the layered structure.

The process wherein the substrate layer has an electrical resistance in a range of from 1 Mohm to 10 Mohm is furthermore preferred.

The present invention also provides a layered structure obtainable by the process described above is proposed.

The present invention furthermore provides an object comprising a layered structure according to the invention or a layered structure produced by the process described above.

The object can be any object which the person skilled in the art would choose in order to provide it with a layered structure according to the invention. Preferably, the object is an object which is to be protected from counterfeiting or manipulation. Furthermore preferably, the object is chosen from the group consisting of a bank note, an official document, such as an identity card, a passport, a driving license, an insurance card, an identification card, a thermoprint for e.g. train tickets, or a combination of at least two of these. The layered structure according to the invention can be incorporated into the object or applied to it. Preferably, the layered structure is incorporated into the object. Furthermore preferably, the layered structure is integrated into the object during production of the object.

The invention also provides a process for determination of information of a layered structure, comprising the steps:
 a. provision of a layered structure according to the invention or a layered structure produced by the process for the production of a layered structure;
 b. electrical contacting of at least one of the layers chosen from the group consisting of the first electrically conductive layer [directly or indirectly] and the further electrically conductive layer or both [directly or indirectly] to a measuring unit;
 c. determination of an electrical parameter of the layered structure;
 d. comparison of the result from step c. with a reference value.

The provision can be effected in any manner which the person skilled in the art would undertake for the provision of the layered structure according to the invention. During the provision, the layered structure can be provided as such or in combination with a further object.

The contacting of at least one of the layers can be carried out in any manner which the person skilled in the art considers appropriate for this. The contacting can be carried out by a direct or an indirect contacting of at least the first or the further layer. In the case of direct contacting, for example, a measuring instrument can be connected directly to one of the layers via a wire, via a measuring lead with spring contact, for charging with a defined pressure. In the case of indirect contacting, for example, a measuring instrument, for example in the form of a transponder, can be brought into the vicinity of the first or the second layer, so that contacting via electromagnetic waves, such as in an RFID system, is possible without contact, that is to say indirectly.

The determination of information of the layered structure is preferably intended for being able to determine a manipulation on the layered structure. The information determined is preferably configured such that it serves for being able to determine a mechanical or chemical change in the layered structure. For this, in the method for determination of information of the layered structure the determination of an electrical parameter of the layered structure from step c. is used. The electrical parameter can be chosen from the group consisting of an electrical resistance, an electric current strength, an electrical capacitance or a combination of at least two of these. Preferably, the electrical parameter is a resistance.

The determination of the electrical parameter of the layered structure can be carried out in any manner which the person skilled in the art would choose for this. The determination is preferably carried out in the manner such as is provided by the contacted measuring instrument. For example, in the determination of a resistance a voltage is applied between two points on the first, the further or on both electrically conductive layers. The current measured can be used in this way to conclude the resistance of the layered structure between the two points applied.

The electrical parameter determined is compared with a reference value. The reference value can be a value which is known for a layered structure on the basis of the nature of the production, or which has been determined after production of the layered structure.

In a preferred embodiment of the method for determination of information of a layered structure, the provision is effected by connection to an object.

The method wherein the information contributes towards differentiation between an original and a counterfeit is preferred.

The invention is now explained in more detail with the aid of figures, measurement methods and non-limiting examples.

Measurement Methods

1) Resistance Measurements for Determination of a Set Value:

A multimeter (Voltcraft LCR 4080) is set to the resistance measurement operating mode and the two measuring leads with spring contact are placed on the contact regions (16, 28) of the layered structure and the resistance measurement result is read off.

The multimeter is then set to the capacitance measurement operating mode and the two measuring leads with spring contact are placed on the contact regions (16, 28) of the layered structure and the capacitance measurement result is read off.

2) Comparison Measurement for Determination of an Actual Value and Comparison with the Set Value:

Error smaller than the change from the set value to the actual value (set values are changed several-fold, e.g. by a factor of 2, during manipulation).

3) Determination of the Bonding Strength:

The determination of the bonding strength is carried out by means of an adhesion tester from Erichsen 58675 Hemer. All the data on the bonding strengths of the first and further part regions to other layers were measured with a Meßdolly of 14 mm diameter. The procedure in this context was as described for this in the handbook.

Compositions

Examples of the composition of the first, further or third electrically conductive composition:
  A) Clevios™ F 010, commercially obtainable from Heraeus Precious Metals GmbH & Co. KG
  B) 10 g of an aqueous polyurethane dispersion (Bayderm Finish 85UDN, Lanxess), 4 g of dimethylsulphoxide, 0.2 g of surfactant (Dynol 604, Air Products GmbH), 0.15 g of silane (Silquest A-187, Momentive Performance Materials Inc.) and 25 g of isopropyl alcohol were added to 60 g of an aqueous PEDOT:PSS dispersion (Clevios™ P, Heraeus Precious Metals GmbH & Co. KG), while stirring.
  C) Clevios™ S V4, a commercially obtainable screen printing paste based on PEDOT:PSS, from Heraeus Precious Metals GmbH & Co. KG
  D) 100 g of an aqueous PEDOT:PSS dispersion (Clevios™ PH 1000, Heraeus Precious Metals GmbH & Co. KG) are adjusted to a pH of 5 with a 10 wt. % strength aqueous ammonia solution, while stirring. 25 g of an aqueous polyacrylate dispersion (Acronal S728, BASF) and 5 g of ethylene glycol are then added.

The drying after bringing of the electrically conductive composition on to the substrate layer takes place at between 60° C. and 130° C., depending on the nature of the substrate layer, for 3 to 15 minutes. After this time the solvent is removed from the composition and the composition is present as a solid electrically conductive layer. Drying takes place in a circulating air drying cabinet from Heraeus GmbH.

PARTICULAR EMBODIMENTS

Embodiment 1

A first embodiment is a layered structure comprising the following layers:
  a) a first substrate layer, wherein the first substrate layer has a first surface and a second surface and is configured as a dielectric;
  b) a first electrically conductive layer which overlaps at least in part the first substrate layer at least on the first surface of the first substrate layer,
wherein the first electrically conductive layer comprises an electrically conductive polymer,
wherein the first electrically conductive layer has at least one first part region and at least one further part region,
wherein the at least one first part region has a higher bonding strength to the substrate layer than to the at least one further part region.

Embodiment 2

The layered structure according to embodiment 1, wherein the layered structure comprises at least one of the following further layers:
  c) a further electrically conductive layer which overlaps at least in part the substrate layer on the second surface;

Embodiment 3

The layered structure according to embodiment 1 or 2, wherein the layered structure comprises at least one of the following further layers:
  d) a film of plastic which overlaps at least a part of the layered structure.

Embodiment 4

The layered structure according to embodiment 1, 2 or 3, wherein the further electrically conductive layer is arranged at least in part in or outside the plane of the second surface on the side of the second surface of the substrate layer; wherein at least in a first contact region the first electrically conductive layer and the further electrically conductive layer are connected electrically by an electrical contact through the substrate layer.

Embodiment 5

The layered structure according to one of embodiments 1 to 4, wherein a third electrically conductive layer is connected to the first electrically conductive layer or the further electrically conductive layer.

Embodiment 6

An object comprising a layered structure according to one of embodiments 1 to 5 or produced by the process according to the invention.

In the following
FIG. 1a shows a diagram of a side view of a layered structure according to the invention having a first electrically conductive layer comprising first and further part regions;
FIG. 1b shows a diagram of a side view of a layered structure according to the invention having a first electrically conductive layer after a manipulation;
FIG. 1c shows a diagram of a side view of a layered structure according to the invention having a first electrically conductive layer and a film of plastic
FIG. 1d shows a diagram of a side view of a layered structure according to the invention having a first electrically conductive layer and a film of plastic after a manipulation;
FIG. 1e shows a diagram of a side view of a layered structure according to the invention having a first and a further electrically conductive layer;
FIG. 1f shows a diagram of a side view of a layered structure according to the invention having a first incomplete electrically conductive layer and a further complete electrically conductive layer;
FIG. 2a shows a diagram of a side view of a layered structure according to the invention having a contact region;
FIG. 2b shows a diagram of a side view of a layered structure according to the invention having a manipulated contact region;
FIG. 3a shows a diagram of a side view of a layered structure according to the invention having a contact region and a third electrically conductive layer;
FIG. 3b shows a diagram of a side view of a layered structure according to the invention having a manipulated contact region and a third electrically conductive layer;
FIG. 4 shows a diagram of a side view of a layered structure according to the invention having two contact regions;

FIG. 7b shows the introduction of a contact region into the layered structure from FIG. 7a;

Figure 1A:
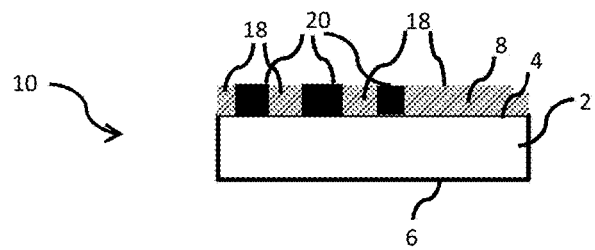
Figure 16A:
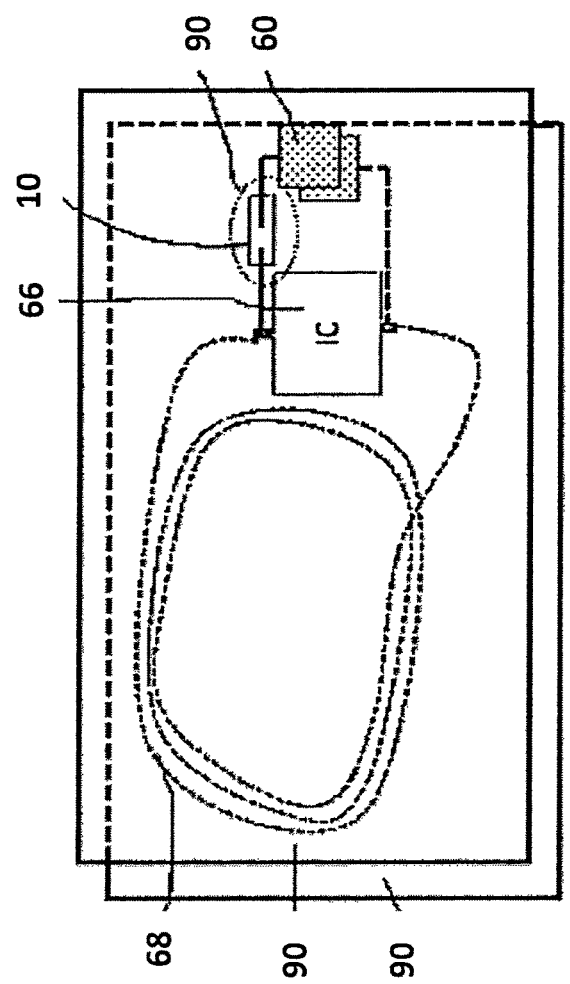
Figure 16B:
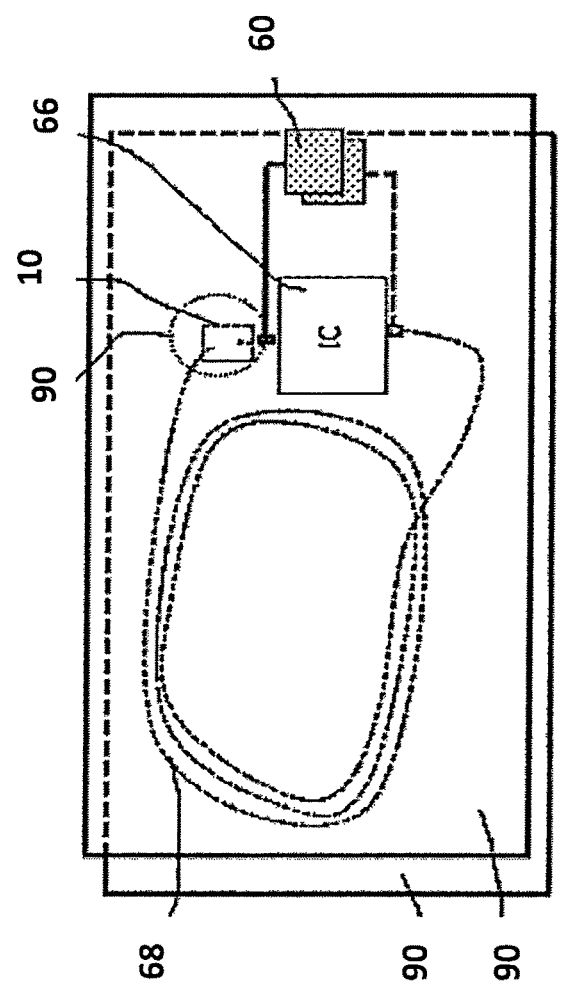

FIG. 10a-d shows a diagram of an object according to the invention having an integrated layered structure according to FIG. 1a;

FIG. 11a-d shows a diagram of an object according to the invention having an integrated layered structure with a protective film;

FIG. 12a-b shows a diagram of a further object according to the invention having an integrated layered structure with a surrounding protective film;

FIG. 13a-b shows a diagram of an alternative object according to the invention having an integrated layered structure and contact region;

FIG. 14a-b shows a diagram of an object according to the invention having an integrated layered structure and contact region and protective film;

FIG. 15a-c shows a diagram of an object according to the invention having an integrated layered structure and contact regions in various planes;

FIG. 16a-b shows a diagram of an object according to the invention having a coil.

Unless mentioned to the contrary, the following composition applies in the following to the materials of the first electrically conductive layer, the second electrically conductive layer and the third electrically conductive layer:

first part region corresponds to Example B both for the first electrically conductive layer 8 and for the further electrically conductive layer 14;

second part region corresponds to Example A both for the first electrically conductive layer 8 and for the further electrically conductive layer 14;

third electrically conductive layer corresponds to Example C or Example D;

of the formulations described above under the examples.

FIG. 1a shows a layered structure 10 according to the invention having a substrate layer 2 made of paper, having a thickness of 0.25 mm and a density of 200 g/m$^2$. The substrate layer 2 has a first surface 4 and an opposite second surface 6. A first electrically conductive layer 8 is applied to the first surface 4 of the substrate layer 2. The electrically conductive layer 8 has various regions. In this example, four first part regions 18 are arranged alternately with three further contact regions 20 on the surface 4 of the substrate layer 2. The part regions 18 and 20 are in direct contact. In this example, the first part regions 18 have a composition as stated in Example B of the compositions and the part regions 20 have a composition as stated in Example A of the compositions. The first electrically conductive layer 8 has an electrical resistance in a range of from 2Ω to 25 kΩ. The bonding strength of the first part regions 18 to the substrate layer 2 is on average 0.15 N/mm$^2$. The bonding strength between the further part regions and the substrate layer is on average 0.12 N/mm$^2$. The bonding strength between the particular adjacent first part regions 18 and the particular further part regions 20 is on average 0.15 N/mm$^2$.

Figure 1B:
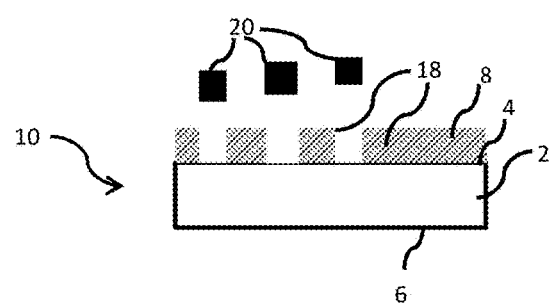

FIG. 1b shows the same layered structure 10, but after a manipulation has taken place on the substrate layer 10. The manipulation can be, for example, an incision into the layered structure or very severe bending, for example by at least 90°, of the layered structure. Due to the different bonding strengths of the part regions 18 and 20 with respect to one another, the manipulation has the effect that the further part regions 20 have become detached from the substrate layer 2 and the particular adjacent part regions 18.

Figure 1C:
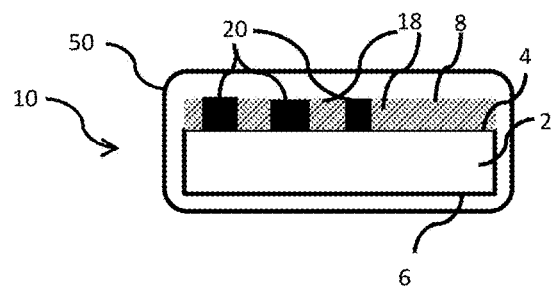

FIG. 1c shows a layered structure 10 according to the invention, in particular a layered structure according to embodiment 3. This layered structure 10 comprises an additional film 50 of plastic, which surrounds the substrate layer 2 and the first electrically conductive layer. The arrangement of the first part regions 18 with respect to the substrate layer 2 and the further part regions 20 is the same as already described for the layered structure 10 from FIG. 1a. The bonding strengths between the first part regions 18 and the film 50 of plastic is on average 0.5 N/mm$^2$. The bonding strengths between the further part regions 20 and the film 50 of plastic is on average 0.5 N/mm$^2$.

Figure 1D:
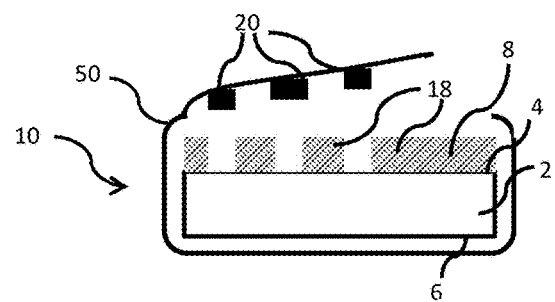

FIG. 1d shows the layered structure 10 from FIG. 1c after a manipulation of the layered structure 10. The manipulation can likewise again be a cutting, a bending of the layered structure or also a tearing off of the film 50 of plastic or an incision into the film 50 of plastic. On the basis of the different bonding strengths between the film 50 of plastic and the various part regions 18 and 20 and, respectively, between the first part regions 18 and the further part regions 20 to the substrate layer 2, a partial detachment of the further part regions 20 together with the film 50 of plastic occurs.

Figure 1E:
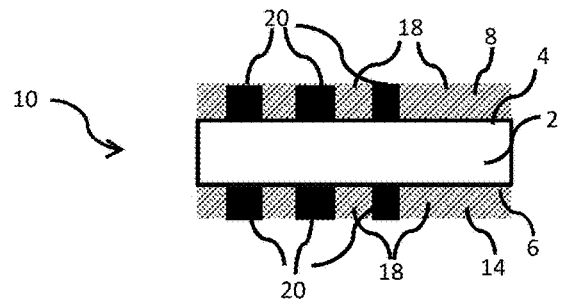

FIG. 1e shows a diagram of the construction of a layered structure 10 according to the invention having a substrate layer 2 and two electrically conductive layers 8 and 14. As described above, the first electrically conductive layer 8 is arranged on the first surface 4 of the substrate layer while the further electrically conductive layer 14 is arranged on the second surface 6 of the substrate layer 2. At least the first electrically conductive layer 8 has at least one first part region 18 and a further part region 20. In this example, the further electrically conductive layer 14 likewise has, in addition to the at least one first part region 18, at least one further part region 20. The substrate layer and the two electrically conductive layers 8 and 14 have the same compositions for the part regions 18 and 20 as described above for FIG. 1a. If on the two surfaces 4 and 6 of the substrate layer 2 there are electrically conductive layers 8 and 14 with various part regions 18 and 20 which have different bonding strengths to one another than to the substrate layer 2, both manipulations which are performed on the under-side on the layered structure 10 and manipulations which are performed on the upper side of the layered structure 10 can be recognized, since the electrically conductive layer 8 is no longer continuously electrically conductive after the manipulation.

Figure 1F:
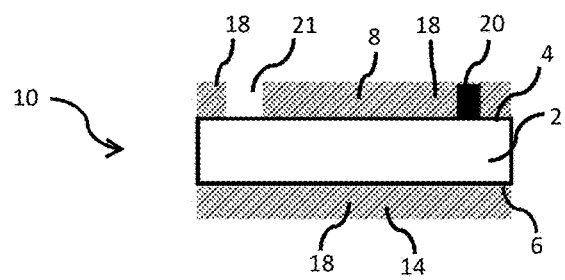

FIG. 1f shows a further embodiment of a layered structure 10 according to the invention. In this case the first electrically conductive layer 8 indeed has at least one first part region 18 and also at least one further part region 20, but the further conductive layer 14 has only one first part region 18. It is furthermore shown in this embodiment that the first electrically conductive layer 8 does not have to be formed as a layer 8 over the complete surface of the substrate layer 2, but can also overlap the substrate layer 2 only in parts. This is shown here in diagram form by the gap 21 in the first electrically conductive layer 8.

Figure 2A:
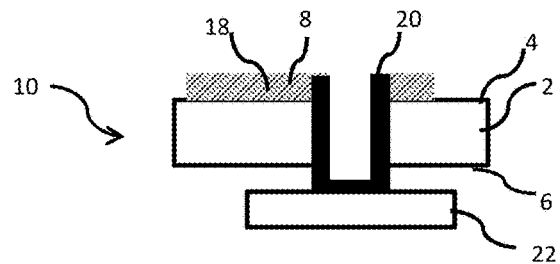
Figure 2B:
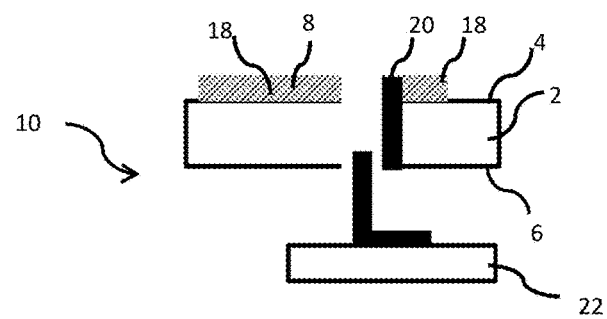

FIGS. 2a and 2b show an embodiment of a layered structure 10 having a further substrate layer 22. As in FIG. 1a, the first substrate layer 2 has on its first surface 4 a first electrically conductive layer 8 with at least one first part region 18 and at least one further part region 20. The further substrate layer 22 in this case is connected via a further part region 20 to two first part regions 18 through the substrate layer 2 at the plane of the second surface 6 of the substrate layer 2, as shown in FIG. 2a. As shown in FIG. 2b, in this manner both a manipulation which is performed on the side of the first substrate layer 2 and a manipulation which is performed on the side of the further substrate layer 22 is made recognizable. By both variants of a manipulation at least a part of the further part region 20 is torn off from the adjacent first part region 18, so that the electrically conductive layer 8 is no longer electrically conductive.

Figure 3A:
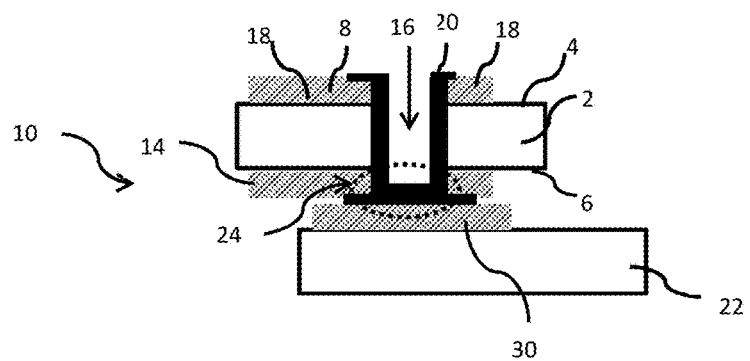

FIG. 3a shows an embodiment of a layered structure 10 according to the invention having a first substrate layer 2, a first electrically conductive layer 8, a further electrically conductive layer 14, a third electrically conductive layer 30 and a second substrate layer 22. A further part region 20 of the first electrically conductive layer 8 is connected electrically through the first substrate layer 2 both to the further electrically conductive layer 14 and to the third electrically conductive layer 30 in the contact region 16. There is consequently a contact 24 at least between the further part region 20 and the further electrically conductive layer 14.

Figure 3B:
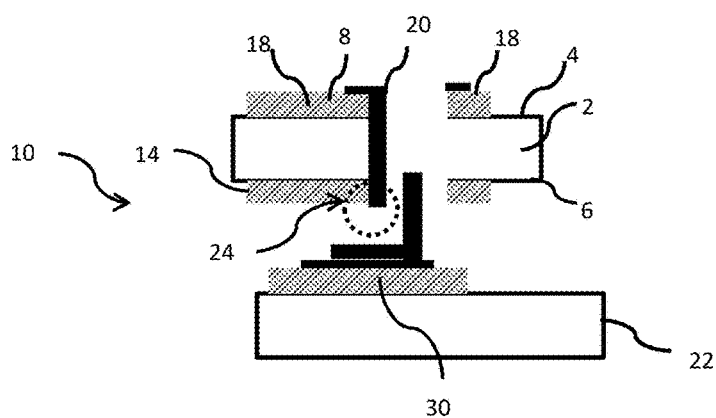

FIG. 3b shows the layered structure 10 from FIG. 3a after a manipulation on the first 2 or the further substrate layer 20. The contact 24 in the contact region 16 is interrupted, since the further part region 20 has been separated both from a first part region 18 and from a part of the further electrically conductive layer 14.

Figure 4:
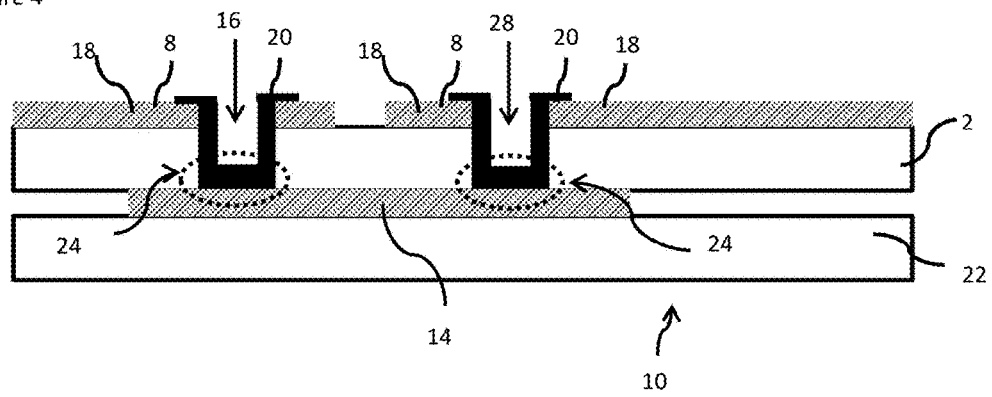

FIG. 4 shows a layered structure 10 according to the invention with two contact regions 16, 28. Both the first contact region 16 and the further contact region 28 have a contact 24 between the particular further part region 20 of the first electrically conductive layer 8 to the further electrically conductive layer 14. In this example the layered structure has no third electrically conductive layer 30, but this could be realized in a further embodiment. The further electrically conductive layer 14 is bonded to a further substrate layer 22. The further substrate layer 22 is in this case a polymer layer.

Figure 5A:
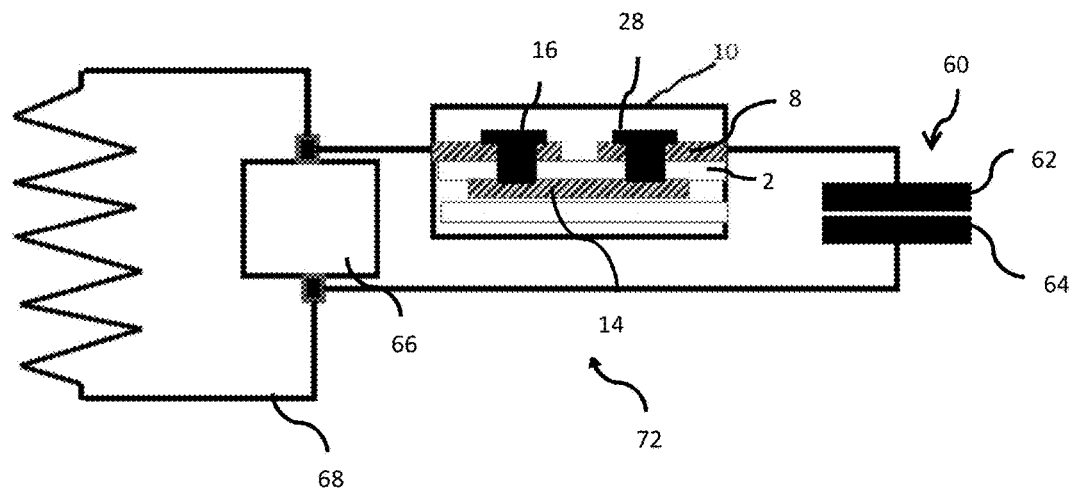
FIG. 5a shows a diagram of a side view of a layered structure according to the invention having two contact regions arranged in series with a capacitor.
Figure 5B:
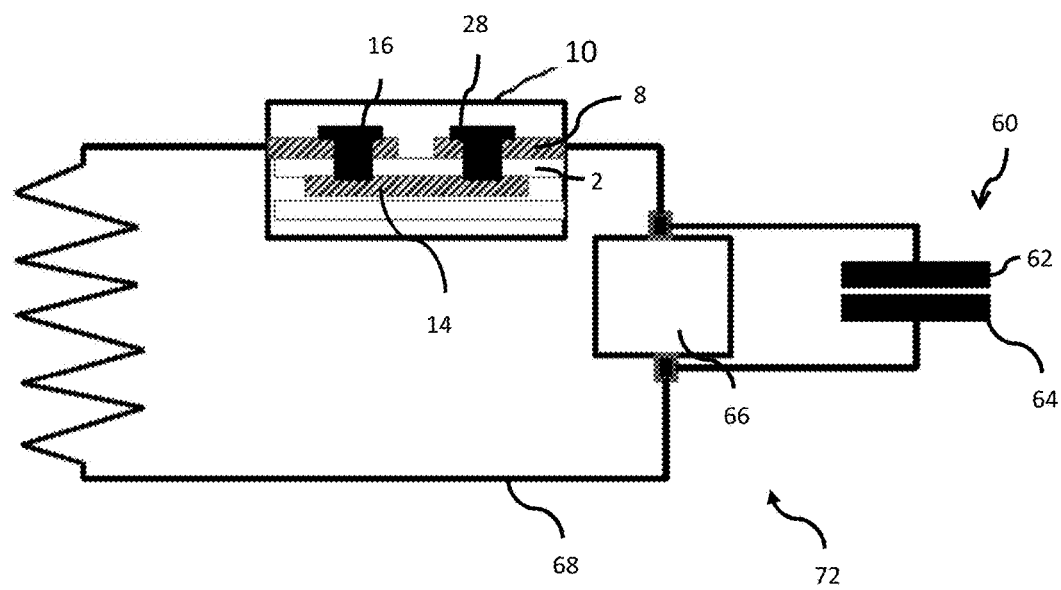
FIG. 5b shows a diagram of a side view of a layered structure according to the invention having two contact regions arranged in series to form a coil.

FIGS. 5a and 5b show the use of a layered structure 10 in an electrical circuit 72. In FIG. 5a the layered structure 10 is connected via one of the electrically conductive layers 8 or 14 to a first capacitor plate 62, in the form of an anode 62 of a capacitor 60, on the one side and to a microcontroller 66 on the other side of the contact regions 16, 28. The electrical circuit 72 furthermore has a coil 68 connected to the microcontroller 66. The microcontroller 66 is furthermore connected to the second capacitor plate 64, in the form of a cathode 64. In FIG. 5b the layered structure 10 is integrated into the coil 68.

Figure 6A:
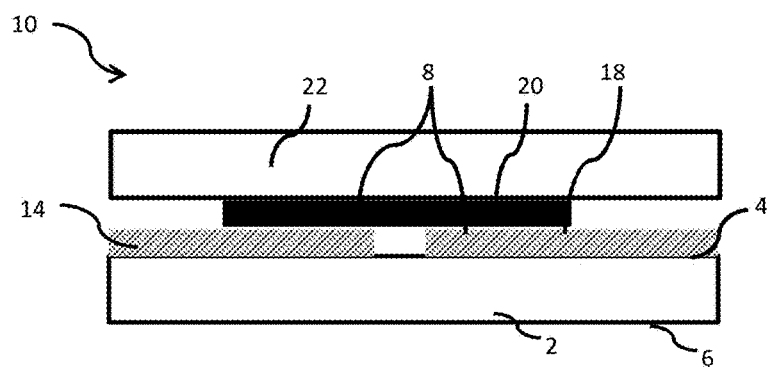
FIG. 6a shows a diagram of a side view of a layered structure according to the invention having part regions arranged one above the other.

FIG. 6a shows a layered structure 10 comprising a first substrate layer 2, which is overlapped by a first electrically conductive layer 8. The first electrically conductive layer 8 has two first part regions 18 and at a further part region 20. The two first part regions 18 are in direct contact with the substrate layer 2 on the first surface 4 of the substrate layer 2. The further part region 20 is above the first electrical part region 18, that is to say arranged pointing from the first surface 4 of the substrate layer 2, and has no direct electrical contact with the substrate layer 2. If the layered structure is constructed stepwise from the bottom upwards, an electrical contact is formed. The two first part regions 18 are in direct contact with the further part region 20. Above the further part region 20, that is to say pointing from the first surface 4 of the substrate layer 2, a further substrate layer 22 is in direct contact with the further part region 20. The bonding strength of the first part regions 18 to the substrate layer 2 is on average 0.15 N/mm$^2$. The bonding strength between the two first part regions 18 and the further part region 20 is on average 0.15 N/mm$^2$. The bonding strength between the further substrate layer 22 and the further part region 20 is on average 0.12 N/mm$^2$.

Figure 6B:
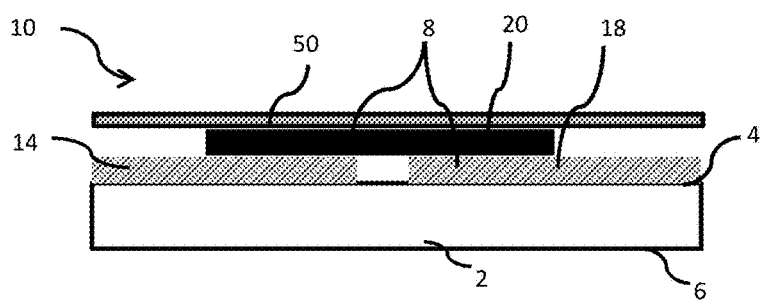
FIG. 6b shows a diagram of a side view of a layered structure according to the invention having part regions arranged one above the other and a film of plastic.

FIG. 6b shows a layered structure identical to FIG. 6a, with the difference that the second substrate layer 22 is replaced by a film 50 of plastic. The bonding strengths are the same as described for FIG. 6a. The embodiment of the layered structure 2 as shown in FIG. 6b corresponds in particular to embodiment 3.

Figure 7A:
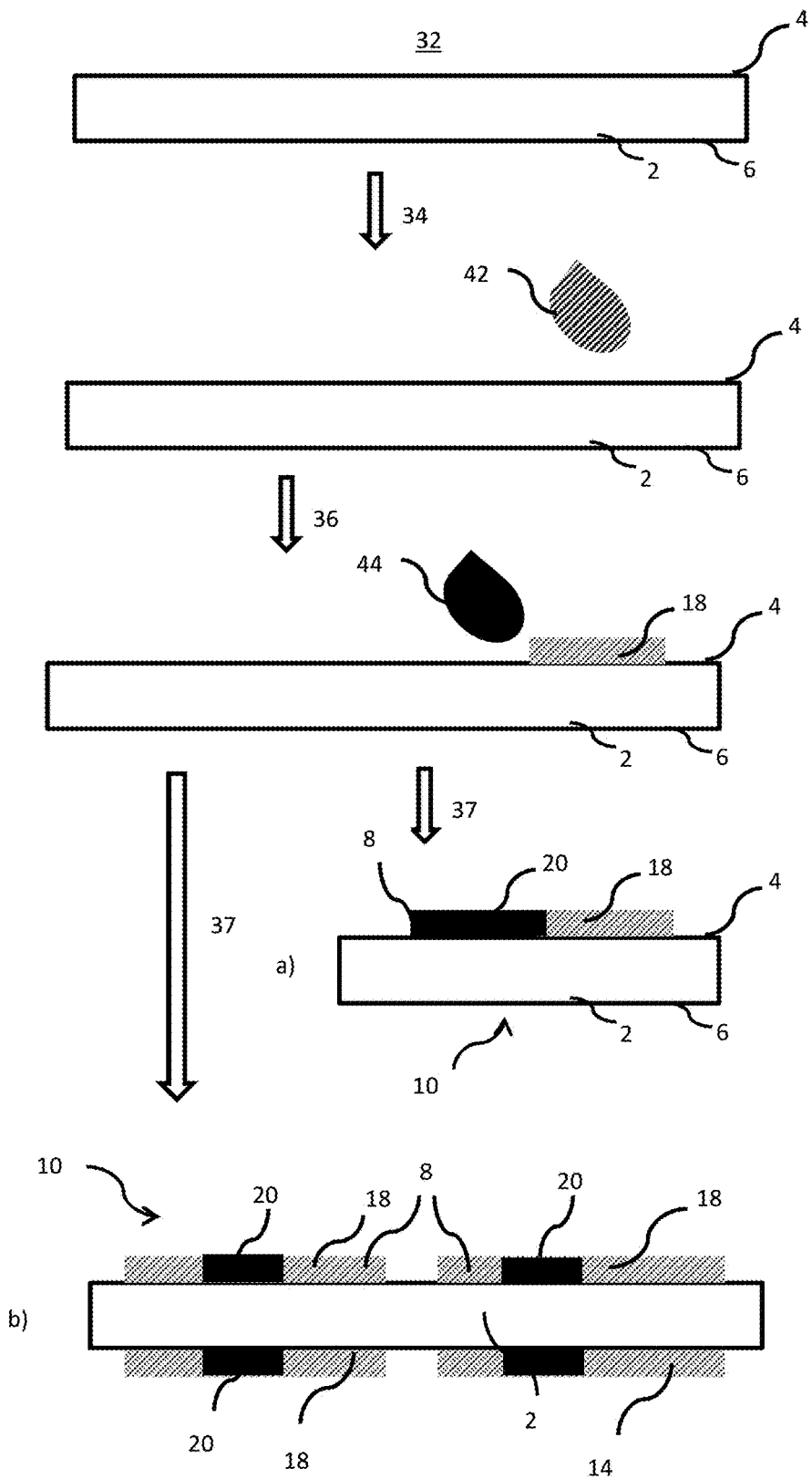
FIG. 7a shows a diagram of the production process of a layered structure according to the invention.
Figure 7B:
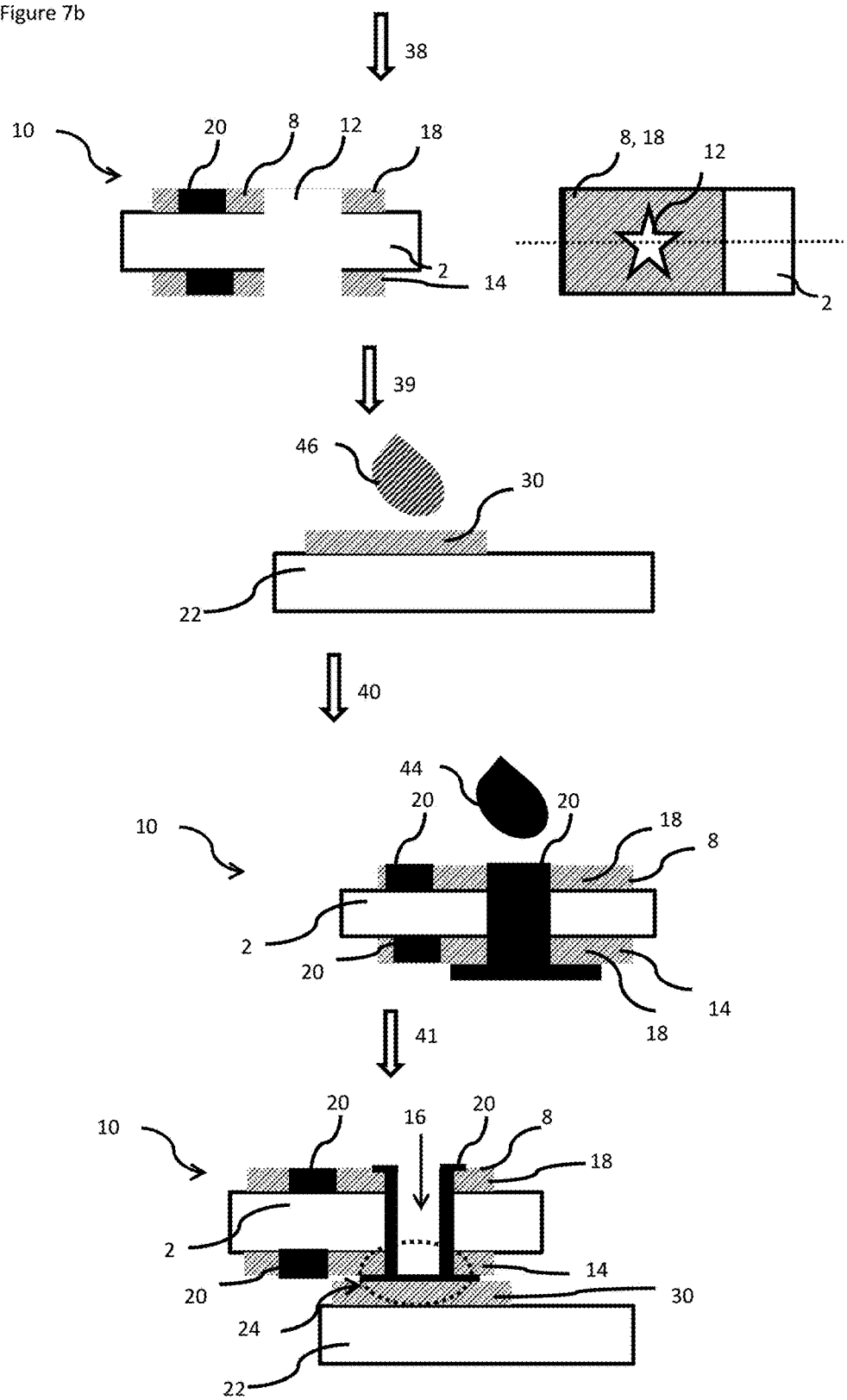

FIGS. 7a and 7b show the various steps of the process according to the invention for the production of layered structure 10. FIG. 7a shows in a first step i) 32 the provision of a substrate layer 2. Preferably, the provision takes place in an installation for printing, in which a first electrically conductive composition 42 is applied in the second step ii) 34 for production of the at least one first part region 18 for production of the first electrically conductive layer 8. The application of the first electrically conductive composition 42 takes place on the first surface 4 of the substrate layer 2. The application takes place by means of a printing process, for example by screen printing (ESC, ATMA AT 80P machine) with a polyester woven fabric having 140 meshes per centimeter. Thereafter, the composition 42 is dried or cured by means of IR radiation in order to obtain the layer 18.

The first electrically conductive composition 42 can likewise be used to produce a first part region on the second surface 6 of the substrate layer 2 (however, this is not shown in step 36, but only after the fourth step iv) 37). In the third step iii) 36, a further electrically conductive composition 44 is applied to at least a part of the first surface 4 of the substrate layer 2. Thereafter, the composition 44 is dried or cured by means of IR radiation in order to obtain the layer 20. The dose for drying or curing the compositions 42 and 44 depends, according to the composition, on which of the resulting layers 18 or 20 is to adhere more strongly to the surfaces 4 and 6 respectively of the substrate layer 2. The composition which is to show a better adhesion compared with the other paste is often dried or cured with a higher dose.

For an embodiment from FIG. 6a or 6b, the further electrically conductive composition 44 can also be applied in the third step iii) 36 directly to the first electrically conductive composition 42. In this context, the second electrically conductive composition 44 has no direct contact with the substrate layer 2.

In the fourth step iv) 37 the contacting of the first part region 18 with the further part region 20 takes place by direct application of the further electrically conductive composition 44 on to or adjacent to the first part region 18, which is already on the surface 4 of the substrate layer 2. The drying of the electrically conductive compositions 42 and 44 takes place, for example, at a temperature of 120° C. for 10 minutes in a circulating air drying cabinet from Heraeus GmbH. At the end of the fourth step iv) 37, a layered structure 10 according to the invention is obtained. This can, as shown in step 37a), be electrically conductive layer 8 having at least one first part region 18 and at least one further part region 20 formed only on the first surface 4. Alternatively, the layered structure 10 can be a further electrically conductive layer 14 on the second surface 6 of the substrate layer 2 as shown in step 37b), which corresponds to step v) of the process according to the invention. This second electrically conductive layer 14 can also have at least one first part region 18 and a further part region 20. In variant b) after step 37, the electrically conductive layer 8 or 14 is applied only in parts to the substrate layer 2 both on the first surface 4 of the substrate layer 2 and on the second surface 6 of the substrate layer 2. It is also conceivable that the entire first surface 4 or the entire second surface 6 or both is covered with the electrically conductive layer 8 or 14. Alternatively, only a part of the first surface 4 or the second surface 6 or both can be covered with a continuous layer 8 or 14. After this fourth step iv) 37, the layered structure 10 already has an arrangement according to the invention of the various layers 2, 8 and 14 such as can be employed for securing against manipulation. This corresponds in particular to embodiment 1 or embodiment 2 as described above.

In the following, the layered structure 10 from step 37 b) is the starting material for acquiring a layered structure 10 according to the invention, in particular for acquiring a layered structure 10 according to embodiment 5. In the fifth step 38, which can optionally also take place after the first step i) 32 or the second step ii) 34, a hole 12 is introduced at least into the substrate 2 of the layered structure 10. If one or more part regions 18, 20 are already applied to the substrate layer 2, these can likewise be bored through in order to allow the hole 12 to form. The hole 12 is produced, for example, by means of a stamping tool, such as are known to the person skilled in the art for producing holes in fabric or leather. Preferably, the hole 12 is produced with the highest possible side surface. This is effected, for example, by producing a star-shaped hole 12, as shown in FIG. 7 after step 38. In this case the hole 12 penetrates through both the substrate layer 2 and the first part regions 18 which are both on the first surface 4 of the substrate layer and on the second surface 6 of the substrate layer 2. The breakthrough for the hole can furthermore be configured such that the hole 12 widens to one side. This can be achieved, for example, in the form of an enlarged breakthrough edge 78 on the side towards the second surface 6 of the hole 12, as shown in FIG. 9b. The widening can be achieved by a special tool during production of the hole 12 or after production of a straight hole 12 and subsequent widening of the breakthrough edge 78 on the second surface 6.

In a sixth step vi) 39 a third electrically conductive composition 46 is applied to a further substrate layer 22. This preferably takes place using the printing method described above for the first electrically conductive composition 42. The further substrate layer 22, like the first substrate layer 2 also, is made of a paper, e.g. bank note paper, document paper, thermopaper, film of plastic or a combination thereof. The third electrically conductive composition 46 has the same composition as the first electrically conductive composition 42.

In the seventh step v)b) 40, the second electrically conductive composition 44 is introduced into the hole 12 of the layered structure 10, corresponding to a part of step v)b) of the process according to the invention. This can be carried out by dropwise addition of the composition 44 by means of a dispenser or a metering pump.

While the second electrically conductive composition 44 is being introduced into the hole 12, the further substrate layer with the third electrically conductive composition is contacted in the eighth step 41 with the electrically conductive composition 44 flowing through the hole 12, which corresponds to the second part of step v)b) of the process according to the invention. The layered structure 10 formed with the first 2 and further substrate layer 22 is dried at 100° C. in a drying cabinet from Heraeus GmbH for 15 min. During drying, the contact region 16 forms. By this procedure, a continuous further part region 20 is formed on the side walls of the hole 12. In the contact region 16 of the layered structure 10 formed, an electrical contact 24 exists between the further part region 20, which extends through the hole 12, and the further electrically conductive layer 14 and the third electrically conductive layer 30. In this manner, an electrical line exists from the first surface 4 through the substrate layer 2 to the second surface 6 of the layered structure 10.

A layered structure 10 corresponding to embodiment 5 is obtained by the production process described.

Figure 8A:
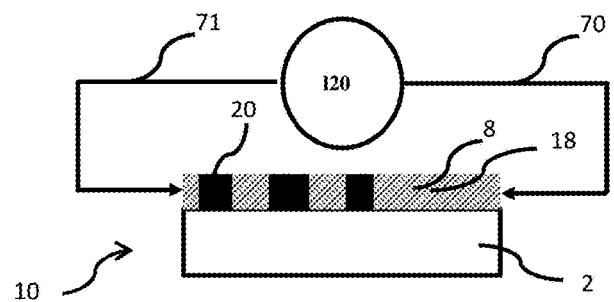
FIG. 8a shows a diagram of a side view of a layered structure according to the invention during the determination of a set value of an electrical property.

FIG. 8a shows a diagram of how a layered structure 10 having a substrate layer 2 and a first electrically conductive layer 8, corresponding to embodiment 1, can be read electrically. The electrical reading is carried out by means of a measuring unit 120, which is connected via a first contact 70 and a second contact 71 to the two ends of the electrically conductive layer 8. The measuring unit 120 measures, as explained in the measurement methods, a resistance of the layered structure 10, which also serves as the set resistance of the non-manipulated, intact layered structure 10 as a reference for later comparison measurements.

Figure 8B:
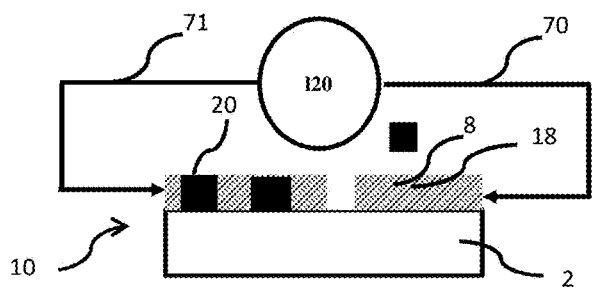
FIG. 8b shows a diagram of a side view of a layered structure according to the invention during the determination of a value of an electrical property after manipulation.

FIG. 8b shows the measurement of a manipulated layered structure 10. Here also, a measuring unit 120 is connected via a first contact 70 to one end of the electrically conductive layer 8 and via a second contact 71 to the opposite end of the electrically conductive layer 8. A resistance is in turn determined under the same conditions as described in the measurement for FIG. 8a. Due to the manipulation which has taken place, which manifests itself in the broken-out part region 20 in FIG. 8b, the result of resistance measurement differs from that of the intact layered structure 10 from FIG.

8*a*. On the basis of the difference in the resistance measurements, the layered structure 10 from FIG. 8*b* can be identified as manipulated.

Figure 8C:
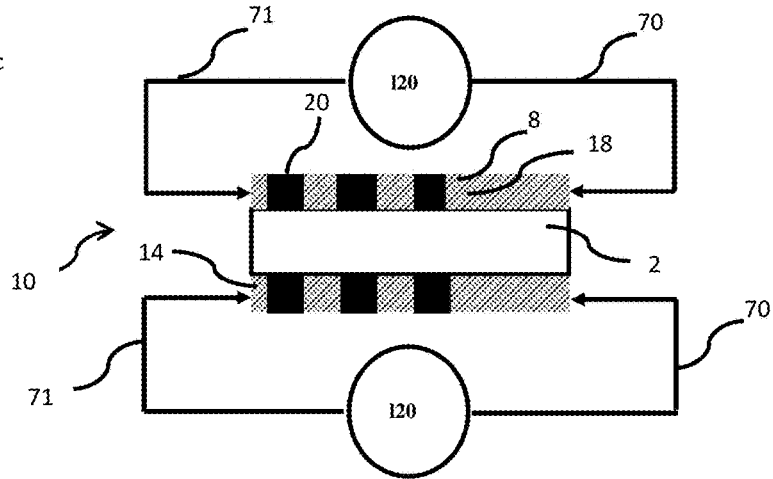
FIG. 8c shows a diagram of a side view of a layered structure according to the invention with a further electrical layer during the determination of a set value of an electrical property.

FIG. 8*c* shows a measurement of a layered structure 10 having a substrate layer 2, a first electrically conductive layer 8 and a further electrically conductive layer 14. In addition to the determination of the resistance of the first electrically conductive layer 8, as already described above for FIG. 8*a*, the second electrical layer 14 can also be measured in the same manner. By measurement of the two electrically conductive layers 8 and 14, both a manipulation on the first surface 4 of the substrate layer 2 and of the layers lying above this and on the second surface 6 of the substrate layer 2 and of the layer lying underneath this can be established.

Figure 8D:
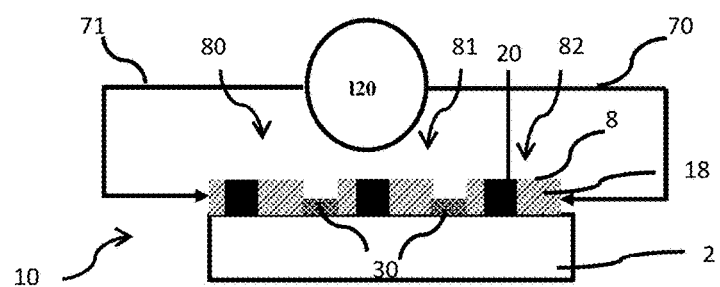
FIG. 8d shows a diagram of a side view of an object according to the invention having three layered structures according to the invention during the determination of a set value of an electrical property.

FIG. 8*d* shows a layered structure 10 which has several regions 80, 81, 82, which can also be called resistances 80, 81, 82, in an electrically conductive layer 8. The first region 80 is connected to the second region 81 and this in turn is connected to the third region 82 via a third electrically conductive layer 30. In the determination of the resistance with a measuring unit 120, a total resistance composed other individual resistances 80, 81 and 82 is determined, as described for FIG. 8*a*.

Figure 9A:
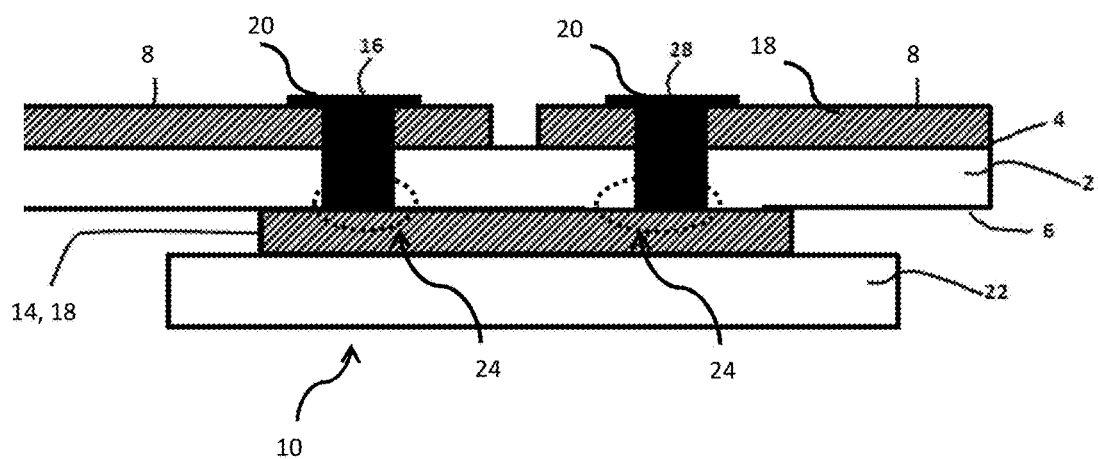
FIG. 9a shows a diagram of a side view of a layered structure according to the invention having two contact regions connected via the further electrically conductive layer.
Figure 9B:
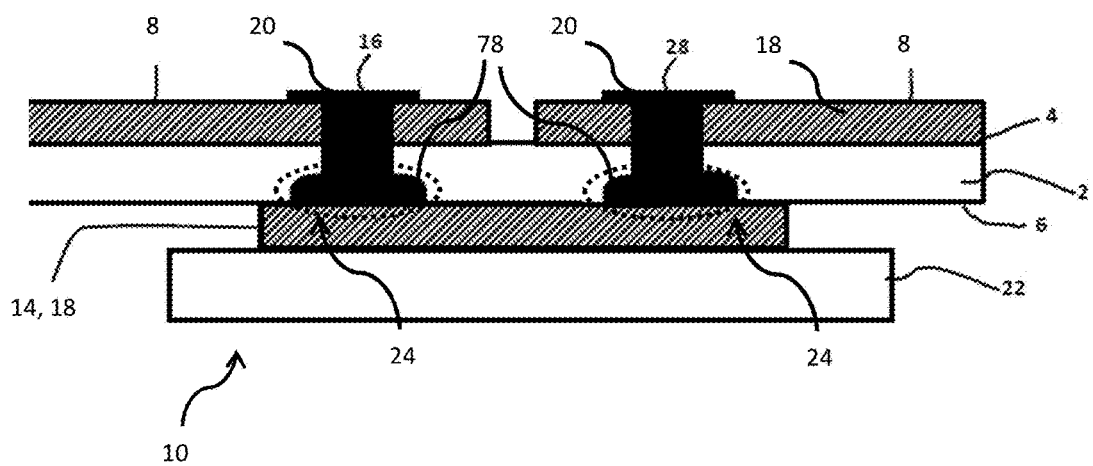
FIG. 9b shows a diagram of a side view of a layered structure according to the invention having two contact regions connected via bulges with the further electrically conductive layer.

FIGS. 9*a* and 9*b* in each case show a layered structure 10 which comprises a first substrate layer 2, a first electrically conductive layer 8 and a further electrically conductive layer 14 as well as a further substrate layer 22. The first electrically conductive layer 8 is not formed continuously on the substrate layer 2. There are two contact regions 16 and 28 in the first substrate layer 2. The first contact region 16 is connected electrically to the second contact region 28 via the second electrically conductive layer 14. In the determination of the set resistance value, the measuring unit 120 can be connected either to the first electrically conductive layer 8 or to the further electrically conductive layer 14. A manipulation manifests itself in the increase in the resistance value of the layered structure 10 due to the destruction of the electrical contact 24 in one or both contact regions 16 and 28.

FIG. 9*b* shows two contact regions 16 and 28, which have been introduced into a widened hole 12. Due the widening of the breakthrough edge 78 of the hole 12, a lower transition resistance can exist in the contact regions 16, 28 between the further part region 20 and the further electrically conductive layer 14.

Figure 9C:
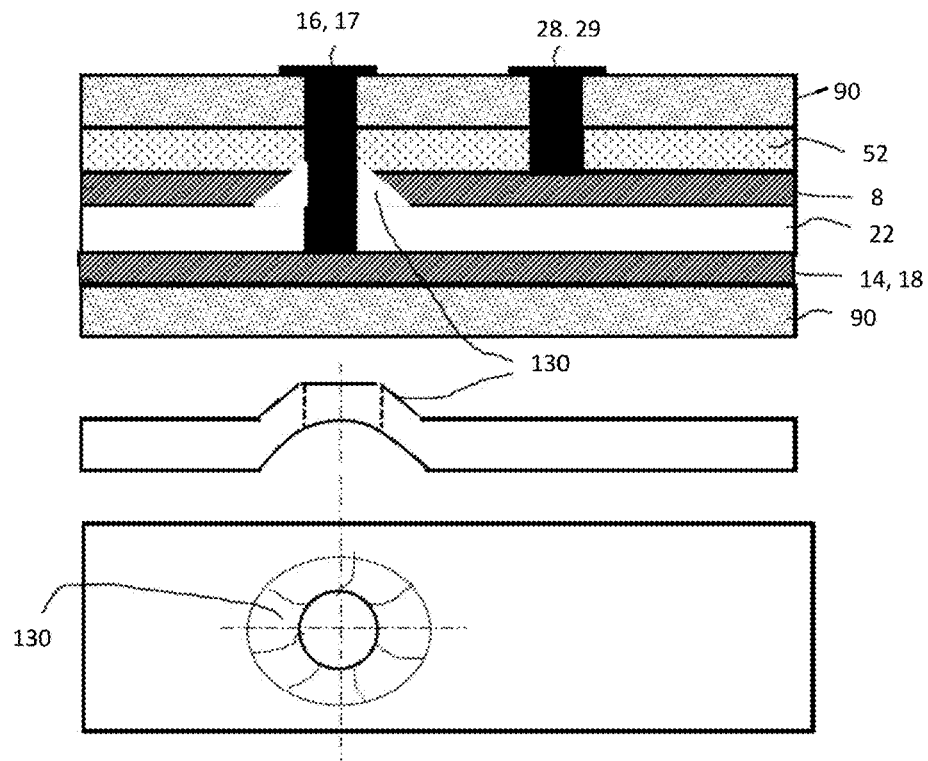
FIG. 9c shows a diagram of a side view of a layered structure according to the invention having two contact regions and a breakthrough edge.
Figure 9D:
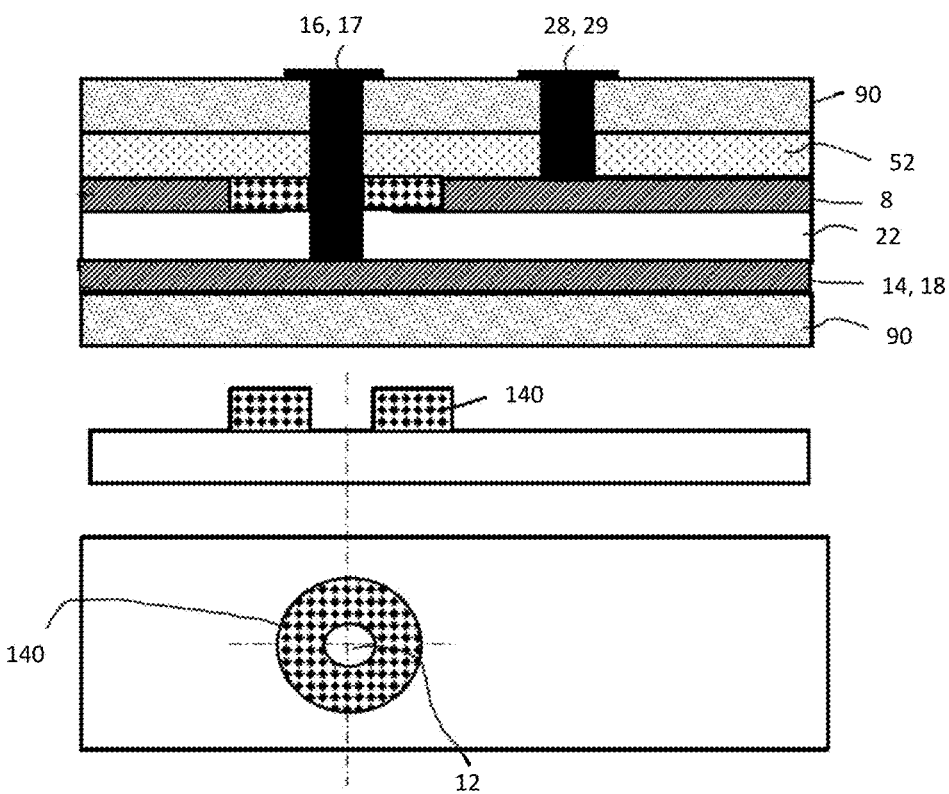
FIG. 9d shows a diagram of a side view of a layered structure according to the invention having two contact regions and an insulating breakthrough edge.

FIGS. 9*c* and 9*d* show a construction of two contact regions 16, 28 in a layered structure 10. The first contact region 16 is connected on one end to a further electrical layer 14 and leads through a further substrate layer 22, a first electrically conductive layer 8, an adhesive layer 52 and a protective layer 90, for example of polycarbonate. The other end of the contact region 16 faces outwards out of the layered structure 10. This end of the contact region 16 can be used as a contact point 17 of the contact region 16 or of one of the electrically conductive layers (8 14, 30). Below the further electrically conductive layer 14 is yet a further protective layer 90. The further contact region 28 reaches merely through the upper protective layer 90, the adhesive layer 52 up to the first electrically conductive layer 8, on which the contact region 28 ends with its one end. The other end of the contact region 28 likewise faces, as with the contact region 16, outwards through the protective layer 90 as the contact point 29. The contact points 17 and 29 preferably serve to connect a measuring unit 120 (not shown here) to the layered structure 10, in order to determine information of the layered structure 10, preferably an electrical parameter of the layered structure 10. Preferably, the protective layer 90 surrounds the layered structure 10 completely, apart from the two contact points 17 and 29. Although the contact region 16 is led through the first electrically conductive layer 8, in this embodiment no electrical contact takes place between the contact region 16 and the first electrically conductive layer 8. The reason for this is a recess 130 in the first electrically conductive layer 8. For introduction of the recess 130, the substrate layer 22 is initially taken as an individual layer and deep-drawn at the point at which the recess 130 is to be introduced. During later bringing together of further layers in the layered structure 10, the substrate layer 2 pretreated in this way is joined with an accurate fit with the adjacent layers 8, 14, 52, 90. The deep-drawn collar seals off the plane, so that during dropwise addition of the further electrically conductive composition 44 for introduction of the contact 16, no electrical connection forms on the side to the first electrically conductive layer 8.

FIG. 9*d* shows the same construction of the layered structure 10 as in FIG. 9*c*, with the difference that a sealing material 140 has been introduced into the recess 130 from FIG. 9*c*. The sealing material preferably comprises silicone.

FIG. 10*a* shows an object 100, in particular an object according to embodiment 1 or 6. The object 100 in this case is an identity card document which comprises a layered structure 10 according to the invention. The side view of the identity card from FIG. 10*a*, as shown in FIG. 10*b*, illustrates that the layered structure 10 comprises a first substrate layer 2 which corresponds to the coloured paper layer of the identity card. The layered structure 10 thus corresponds to embodiment 1. A first part region 18 of a first electrically conductive layer 8 is applied in the form of a line to parts of the substrate layer 2. In this embodiment, the electrically conductive layer 8 is led as a line over personalization regions 98 which are at risk of manipulation. A further part region 20 is applied to a further part of the substrate layer 2 and to a part of the first electrically conductive layer 18. The electrically conductive layer 8 preferably comprises a single line, as shown in FIG. 10*a*. In FIG. 10*a* the personalisation regions 98, in particular the photo of the identity card, are additionally identified by a rectangle 98 for better recognition of this region. Often only a line of the electrically conductive layer 8 is drawn over the personalization region 98, so that during manipulations a destruction of the electrically conductive layer 8 also takes place. Preferably, the dimensions of the electrically conductive regions of the layer 8 are not too large, in order to achieve a local complete destruction of the line during a manipulation. The line preferably has a thickness of approx. 2 mm and a height of approx. 500 nm. By destruction of the line, as shown in FIG. 10*d*, a sudden change in the first electrically conductive layer 8 arises. This can be ascertained by means of a measuring device 120, as shown in FIGS. 10*c* and 10*d*. The measuring device 120 can be designed such that it can compare the set resistance 92 with the actual resistance 94 directly and detect a manipulation with the aid of a difference, which preferably corresponds to at least a factor of 2, or preferably at least a factor of 5.

The electrically conductive layer 8 has various regions 80 to 85 which represent various resistances 80 to 85. The first resistance 80 is connected to the second resistance 81 via a third electrically conductive layer 30 (not shown here), as has been described in FIG. 8*d*. In just the same way, the second resistance 81 is connected to the third resistance 82, which in turn is connected to the fourth resistance 83, which in turn is connected to the fifth resistance 84 and this in turn is connected to the sixth resistance 85, in each case via a third electrically conductive layer 30. The third electrically conductive layer 30 in this case is made of the same material as the first conductive layer 8. The ends of the electrically conductive layer 8 in each case have an open structure for contacting the first electrically conductive layer 8 to a measuring unit 120.

FIG. 11a likewise shows an object 100, in particular an object according to embodiment 6, in the form of an identity card, having an integrated layered structure 10. The construction of the first electrically conductive layer 8 corresponds to the construction shown in FIG. 1a, with alternating first part regions 18 and further part regions 20 as shown in FIG. 11b. The electrically conductive layer 8 is applied to the substrate layer 2, which is present in the form of the paper layer of the object 100. The electrically conductive layer 8 has a width of 2 mm and a thickness of 0.5 μm. An adhesive layer 52 which bonds a film 50 of plastic to the first electrically conductive layer 8 is applied over the first electrically conductive layer 8. The film 50 of plastic is made of polycarbonate. For contacting the first electrically conductive layer 8, the ends of the first electrically conductive layer 8 are configured as a first 16 and further contact region 28, as is shown in FIG. 11d. A measuring unit 120 can be connected to these contact regions 16 and 28 in order to measure the set resistance 92 of the layered structure 10 of the object 100 which is present after production of the layered structure 10, that is to say before its first use. The measuring unit 120 can furthermore determine an actual resistance 94 during use, which can indicate a manipulation if the set resistance and actual resistance differ by at least 40%. The set resistance and actual resistance can be in the range of from 1 to 100,000,000Ω.

FIG. 11c shows the destruction of the first conductive layer 8 after a manipulation. The further part regions 20 have been separated from the first part regions 18 on the basis of their higher bonding strength to the protective film 90 (this can also correspond to the film 50 of plastic) or on the basis of a weaker bonding strength to the substrate layer 2, so that the electrical resistance of the first electrically conductive layer 8 is increased several-fold.

FIGS. 12a and 12b show a layered structure 10 as from FIG. 11, with the difference that the layered structure 10 is surrounded by a protective layer 90 on both sides of the substrate layer 2.

FIG. 13 shows an object 100, in particular an object 100 according to embodiment 6, in the form of an identity card having an integrated layered structure 10. The layered structure 10 itself corresponds to the construction according to embodiment 5. The layered structure 10 comprises a substrate layer 2, a first electrically conductive layer 8 having at least one first part region 18, as shown in FIG. 13b. The contact region 16 and the contact region 28 comprise the further part region 20. If one of the layers 52, 14, 2 or 18 of the object 100 is peeled off, cut off or cut into, the first part region 18 is separated from the further part region 20. The manipulation can be determined with the aid of a measuring unit 120, as shown in FIG. 13b. An actual capacitance 97 is determined and compared with a set capacitance 96.

FIG. 14a shows an object 100, in particular an object 100 according to embodiment 6, likewise in the form of an identity card having an integrated layered structure 10. The layered structure 10 corresponds to the construction according to embodiment 5. The layered structure 10 comprises a substrate layer 2, a first electrically conductive layer 8 having at least one first part region 18, as shown in FIG. 14b. In contrast to the embodiment from FIG. 13a, the embodiment from FIG. 14 has only one contact region 16, which is led through the substrate layer 2. This contact region comprises the further part region 20. The contact region 16 is in electrical contact with a further electrically conductive layer 14. The contact region 28 is only in contact with the first electrically conductive layer 8. An adhesive layer 52 which in turn is in contact with a protective layer 90 is arranged above the first electrically conductive layer 8. The protective layer 90, made, for example, of polycarbonate, encloses the entire layered structure 10 apart from two contact points 17 and 29 on the contact regions 16 and 28. If a measuring unit 120 is connected to the contact regions 16 and 28, a set capacitance 96 and, after use, an actual capacitance 97 can be determined.

FIG. 15a is similar in construction to the structure from FIG. 14. A difference from the layered structure from FIG. 14 is illustrated in FIG. 15b, namely that the contact region 16 is passed through the substrate layer 2, without thereby having electrical contact with the first electrical layer 8. The further contact region 28, on the other hand, is led merely through the adhesive layer 52 and the protective layer 90 directly to the electrically conductive layer 8. By this means, manipulation both of the first electrically conductive layer 8 and of the further electrically conductive layer 14 can be detected, as is shown in FIG. 15c.

FIGS. 16a and 16b show two arrangements of in each case a coil 68, which preferably comprise a metal, such as, for example, copper. The coils 68 and capacitors can be configured as a printed circuit or as wire coils, which are connected electrically to a layered structure 10. The layered structure 10 in FIG. 16a is connected in series to a capacitor 60, which corresponds to the construction from FIG. 5a. The construction of the layered structure 10 in an electrical circuit with a capacitor 60 and microcontroller 66 from FIG. 16b corresponds to that from FIG. 5b. In contrast to FIGS. 5a and 5b, the circuit in FIGS. 16a and 16b is completely surrounded by a protective layer 90. In this manner, the object 100 from FIGS. 16a and 16b can serve, for example, as an identification card (ID card) which can store data and send them, for example, to a transponder. In the event of an attempt at manipulation of the ID card 100, the layered structure 10 is destroyed and the electrical circuit to the capacitor 60 or the coil 68 is interrupted.

LIST OF REFERENCE SYMBOLS

| | |
|---|---|
| 2 | first substrate layer |
| 4 | first surface of the substrate layer |
| 6 | second surface of the substrate layer |
| 8 | first electrically conductive layer |
| 10 | layered structure |
| 12 | hole |
| 14 | further electrically conductive layer |
| 16 | first contact region |
| 17 | contact point |
| 18 | first part region |
| 20 | further part region |
| 21 | gap |
| 22 | further substrate layer |
| 24 | electrical contact |
| 26 | third substrate layer |
| 28 | further contact region |
| 29 | contact point |
| 30 | third electrically conductive layer |
| 32 | first step i) |
| 34 | second step ii) |
| 36 | third step iii) |
| 37 | fourth step iv) |
| 38 | fifth step v)a) |

-continued

| 39 | sixth step vi) |
| 40 | seventh step v)b) |
| 41 | eighth step |
| 42 | first electrically conductive composition |
| 44 | further electrically conductive composition |
| 46 | third electrically conductive composition |
| 50 | film of plastic |
| 52 | adhesive layer |
| 60 | capacitor |
| 62 | anode/first capacitor plate |
| 64 | cathode/second capacitor plate |
| 66 | microcontroller |
| 68 | coil |
| 70 | first contact |
| 71 | second contact |
| 72 | electrical circuit |
| 78 | breakthrough edge |
| 80 | first region/first resistance |
| 81 | second region/second resistance |
| 82 | third region/third resistance |
| 83 | fourth region/fourth resistance |
| 84 | fifth region/fifth resistance |
| 85 | sixth region/sixth resistance |
| 90 | protective layer |
| 92 | set resistance $R_{set}$ |
| 94 | actual resistance $R_{actual}$ |
| 96 | set capacitance $C_{set}$ |
| 97 | actual capacitance $C_{actual}$ |
| 98 | personalization region |
| 100 | object |
| 120 | measuring unit |
| 130 | recess |
| 140 | sealing material |

The invention claimed is:

1. An object comprising a layered structure, wherein the layered structure has electrical information such that it can be determined whether the object has been manipulated manually or chemically, the layered structure comprising:
   a) a first substrate layer, wherein the first substrate layer has a first surface and a second surface and is configured as a dielectric;
   b) a first electrically conductive layer which overlaps at least in part the first substrate layer at least on the first surface of the first substrate layer,
   wherein the first electrically conductive layer comprises an electrically conductive polymer,
   wherein the first electrically conductive layer has at least one first part region and at least one further part region, and
   i) wherein at least a part of the at least one first part region overlaps the first surface of the first substrate layer, and wherein the at least one first part region has a higher bonding strength to the substrate layer than the at least one further part region, or
   ii) wherein at least a part of the at least one first part region and at least a part of the at least one further part region overlap the first surface of the first substrate layer and wherein the bonding strength of the at least one first part region to the first substrate layer differs from the bonding strength of the at least one further part region to the first substrate layer.

2. The object according to claim 1, wherein the layered structure further comprises at least one of:
   c) a second electrically conductive layer which overlaps at least in part the substrate layer on the second surface;
   d) a film of plastic which overlaps at least a part of the layered structure.

3. The object according to claim 2,
   wherein the second electrically conductive layer is arranged at least in part in or outside the plane of the second surface on the side of the second surface of the substrate layer;
   wherein at least in a first contact region the first electrically conductive layer and the second electrically conductive layer are connected electrically by an electrical contact through the substrate layer.

4. The object according to claim 3, wherein the electrical contact of the first electrically conductive layer with the second electrically conductive layer in the first contact region is breakable.

5. The object according to claim 2, wherein a second substrate layer overlaps at least in part the first electrically conductive layer or the second electrically conductive layer.

6. The object according to claim 3, wherein the electrical contact is broken by a mechanical influence.

7. The object according to claim 5, wherein at least one of the layers chosen from the group consisting of the first substrate layer, the second substrate layer, a third substrate layer or a combination of at least two of these comprises a substance chosen from the group consisting of a polymer, a glass, a ceramic or a combination of at least two of these.

8. The object according to claim 5, wherein at least one of the layers chosen from the group consisting of the first substrate layer, the second substrate layer, a third substrate layer or a combination of at least two of these has an electrical resistance in a range of from 2Ω to 40 kΩ.

9. The object according to claim 2, wherein at least a part of the first electrically conductive layer or the second electrically conductive layer can be connected to a capacitor.

10. The object according to claim 3, wherein in the first contact region at least a part of the at least one further part region of the first electrically conductive layer contacts the at least one second electrically conductive layer.

11. The layered structure according to claim 3, wherein a third electrically conductive layer is connected to the first electrically conductive layer or the second electrically conductive layer.

12. The object according to claim 11, wherein at least one of the regions chosen from the group consisting of the second electrically conductive layer, the third electrically conductive layer, the contact or at least two of these comprises an electrically conductive polymer.

13. The object according to claim 12, wherein the conductive polymer is a polythiophene.

14. The object according to claim 11, wherein at least one of the regions chosen from the group consisting of the first electrically conductive layer, the second electrically conductive layer, the third electrically conductive layer, the contact or at least two of these has an electrical resistance in a range of from 2Ω to 40 kΩ.

15. The object according to claim 3, wherein the layered structure has at least one further contact region.

16. The object according to claim 15, wherein the first contact region is connected via at least a part of the at least one first part region to the at least one further contact region.

17. The object according to claim 1, wherein the electrically conductive polymer is selected from polypyrroles, polythiophenes, polyanilines, polyacetylenes, polyphenylenes, poly(p-phenylene-vinylenes) and combinations thereof.

18. The object according to claim 1, wherein the electrically conductive polymer is present in a range of about 10 to about 99 wt. %, based on the total amount of the first electrically conductive layer.

19. The object according to claim 1, wherein (i) at least a part of the at least one first part region overlaps the first surface of the first substrate layer, (ii) at least a part of the at least one further part overlaps a surface of the first substrate layer, and (iii) the at least one first part region has a different bonding strength to the first substrate layer than the at least one further part region.

20. The object according to claim 1, wherein at least a part of the at least one first part region and at least a part of the at least one further part region overlap the first surface of the first substrate layer and wherein the bonding strength of the at least one first part region to the first substrate layer differs from the bonding strength of the at least one further part region to the first substrate layer.

21. A method for determination of information of a layered structure connected to an object, the method comprising:
   a) providing an object comprising a layered structure, wherein the layered structure has electrical information such that it can be determined whether the object has been manipulated manually or chemically, the layered structure comprising:
      i) a first substrate layer, wherein the first substrate layer has a first surface and a second surface and is configured as a dielectric;
      ii) a first electrically conductive layer which overlaps at least in part the first substrate layer at least on the first surface of the first substrate layer,
   wherein the first electrically conductive layer comprises an electrically conductive polymer,
   wherein the first electrically conductive layer has at least one first part region and at least one further part region, and
      i) wherein at least a part of the at least one first part region overlaps the first surface of the first substrate layer, and wherein the at least one first part region has a higher bonding strength to the substrate layer than the at least one further part region, or
      ii) wherein at least a part of the at least one first part region and at least a part of the at least one further part region overlap the first surface of the first substrate layer and wherein the bonding strength of the at least one first part region to the first substrate layer differs from the bonding strength of the at least one further part region to the first substrate layer;
   b) electrically contacting at least one of the layers chosen from the group consisting of the first electrically conductive layer and the second electrically conductive layer or both;
   c) determining an electrical parameter of the layered structure; and
   d) comparing the result from step c) with a reference value.

22. The method according to claim 21, wherein the information contributes towards differentiation between an original and a counterfeit.

* * * * *